(12) United States Patent
Takayuki et al.

(10) Patent No.: US 9,713,274 B2
(45) Date of Patent: Jul. 18, 2017

(54) ELECTRONIC APPARATUS

(71) Applicant: Sony Computer Entertainment Inc., Tokyo (JP)

(72) Inventors: Furubo Takayuki, Chiba (JP); Shinichi Takeyama, Chiba (JP); Beppu Hirokuni, Chiba (JP); Nobuyuki Sugawara, Chiba (JP)

(73) Assignees: Sony Corporation, Tokyo (JP); Sony Interactive Entertainment Inc., Tokyo (JP)

( * ) Notice: Subject to any disclaimer, the term of this patent is extended or adjusted under 35 U.S.C. 154(b) by 103 days.

(21) Appl. No.: 14/477,947

(22) Filed: Sep. 5, 2014

(65) Prior Publication Data

US 2015/0077958 A1    Mar. 19, 2015

(30) Foreign Application Priority Data

Sep. 18, 2013  (JP) .................................. 2013-192810
Sep. 18, 2013  (JP) .................................. 2013-192811
Sep. 18, 2013  (JP) .................................. 2013-192812

(51) Int. Cl.
*H05K 5/02*        (2006.01)
*H05K 7/14*        (2006.01)
(Continued)

(52) U.S. Cl.
CPC ......... *H05K 5/0217* (2013.01); *G06F 1/1658* (2013.01); *H05K 7/142* (2013.01); *H01H 13/14* (2013.01); *H01H 2221/044* (2013.01)

(58) Field of Classification Search
CPC .... H05K 5/0217; H05K 7/142; G06F 1/1658; H01H 13/14
See application file for complete search history.

(56) References Cited

U.S. PATENT DOCUMENTS 4,132,344 A * 1/1979 Jewell .................. B65D 43/021
                                                     206/519
5,515,240 A * 5/1996 Rodeffer .............. H05K 7/1417
                                                     206/449
(Continued)

FOREIGN PATENT DOCUMENTS

CN            1920738 A       2/2007
CN            2877194 Y       3/2007
(Continued)

OTHER PUBLICATIONS

Office Action for corresponding JP Application No. 2013-192810, 7 pages dated Feb. 23, 2016.
(Continued)

*Primary Examiner* — David M Sinclair
*Assistant Examiner* — Theron S Milliser
(74) *Attorney, Agent, or Firm* — Matthew B. Dernier, Esq.

(57) ABSTRACT

Electronic apparatus includes a housing configured to have an inner layer portion forming an inner surface and an outer layer portion forming an outer surface. The inner layer portion and the outer layer portion are formed by two-color molding. The electronic apparatus includes one of a region in which the inner layer portion is not formed and a region in which the inner layer portion is thin. The one region is set in the inner surface of the housing. The electronic apparatus further includes a component configured to be housed in the housing and is disposed in the one region.

11 Claims, 17 Drawing Sheets

(51) Int. Cl.
*G06F 1/16* (2006.01)
*H01H 13/14* (2006.01)

(56) References Cited

U.S. PATENT DOCUMENTS

| | | | | |
|---|---|---|---|---|
| 5,944,210 A * | 8/1999 | Yetter | H02G 3/081 | |
| | | | 220/241 | |
| 6,111,760 A * | 8/2000 | Nixon | H04B 1/3833 | |
| | | | 220/4.02 | |
| 6,582,785 B2 * | 6/2003 | Nagata | H05K 9/0073 | |
| | | | 174/377 | |
| 6,693,371 B2 * | 2/2004 | Ziegler | H02J 9/062 | |
| | | | 307/64 | |
| 7,065,209 B2 * | 6/2006 | Stanton | H05K 5/0013 | |
| | | | 220/324 | |
| 8,148,633 B2 * | 4/2012 | Hung | G06F 1/1626 | |
| | | | 174/50 | |
| 8,218,306 B2 * | 7/2012 | Lynch | H01H 9/0207 | |
| | | | 361/679.3 | |
| 8,345,446 B2 * | 1/2013 | Li | H04M 1/0249 | |
| | | | 361/801 | |
| 8,799,935 B2 * | 8/2014 | Jung | G11B 33/022 | |
| | | | 361/679.33 | |
| 8,939,304 B2 * | 1/2015 | Wu | H04M 1/026 | |
| | | | 220/3.92 | |
| 9,084,349 B2 * | 7/2015 | Maebashi | H05K 5/0047 | |
| 9,198,335 B2 * | 11/2015 | Chang | H05K 5/0217 | |
| 2003/0147228 A1 * | 8/2003 | Koike | H05K 7/1417 | |
| | | | 361/801 | |
| 2006/0066769 A1 * | 3/2006 | Minaguchi | G02F 1/133308 | |
| | | | 349/58 | |
| 2007/0047197 A1 | 3/2007 | Kobayashi | | |
| 2009/0117758 A1 * | 5/2009 | Yamaguchi | H05K 7/026 | |
| | | | 439/76.2 | |
| 2009/0159411 A1 * | 6/2009 | Guo | H01H 13/02 | |
| | | | 200/296 | |
| 2010/0101857 A1 * | 4/2010 | Miyamoto | H01R 9/2466 | |
| | | | 174/559 | |
| 2010/0254102 A1 * | 10/2010 | Furubo | H05K 5/0217 | |
| | | | 361/752 | |
| 2011/0026231 A1 * | 2/2011 | Scordino | H05K 7/1417 | |
| | | | 361/759 | |
| 2012/0043867 A1 * | 2/2012 | Wang | H05K 5/0013 | |
| | | | 312/223.1 | |
| 2012/0188694 A1 | 7/2012 | Sakakibara | | |
| 2012/0307433 A1 * | 12/2012 | Takahashi | H05K 5/0013 | |
| | | | 361/679.01 | |

FOREIGN PATENT DOCUMENTS

| | | |
|---|---|---|
| CN | 201854518 U | 6/2011 |
| CN | 202841759 U | 3/2013 |
| CN | 203015305 A | 6/2013 |
| JP | 03044836 A | 2/1991 |
| JP | 5259654 A | 10/1993 |
| JP | 6290680 A | 10/1994 |
| JP | 6334377 A | 12/1994 |
| JP | 07-007179 U | 1/1995 |
| JP | 2004228238 A | 8/2004 |
| JP | 2007128740 A | 5/2007 |
| JP | 2008279688 A | 11/2008 |
| JP | 2008288381 A | 11/2008 |
| JP | 2009123358 A | 6/2009 |
| JP | 2010055361 A | 3/2010 |

OTHER PUBLICATIONS

Office Action for corresponding JP Application No. 2013-192810, dated Jul. 21, 2015.
Office Action for corresponding JP Application No. 2013-192811, dated Jul. 21, 2015.
Office Action for corresponding JP Application No. 2013-192812, dated Jul. 28, 2015.
Office Action for corresponding CN Application No. 2016101301426390, 16 pages dated Oct. 18, 2016.

* cited by examiner

ELECTRONIC APPARATUS

BACKGROUND

The present disclosure relates to a structure of a housing and a support structure of a button in electronic apparatus.

On a circuit board included in electronic apparatus, a component having a comparatively large height in the thickness direction of the circuit board, such as a connector for cable connecting, a battery, and a slot of a memory card, is often mounted (refer to e.g. US Patent Application Publication No. 2012/188694).

SUMMARY

In attempting size reduction of electronic apparatus, the height of a component such as a connector, a battery, and a slot of a memory card often becomes an obstacle. When the housing of electronic apparatus is molded by resin, reducing the thickness of the housing is effective for size reduction of the electronic apparatus in some cases. However, wholly reducing the thickness of the housing lowers the rigidity of the housing. If the thickness of part of the housing is reduced, slight concavities and convexities are generated in the outer surface of the housing due to sink marks of the resin and they impair the appearance of the electronic apparatus in some cases.

According to an embodiment of the present disclosure, there is provided electronic apparatus including a housing configured to have an inner layer portion forming an inner surface and an outer layer portion forming an outer surface. The inner layer portion and the outer layer portion are formed by two-color molding. The electronic apparatus includes one of a region in which the inner layer portion is not formed and a region in which the inner layer portion is thin. The one region is set in the inner surface of the housing. The electronic apparatus further includes a component configured to be housed in the housing and be disposed in the one region. According to this electronic apparatus, size reduction of electronic apparatus can be achieved with the appearance of the electronic apparatus and the rigidity of the housing kept favorable.

DETAILED DESCRIPTION OF THE PREFERRED EMBODIMENTS

Figure 1:
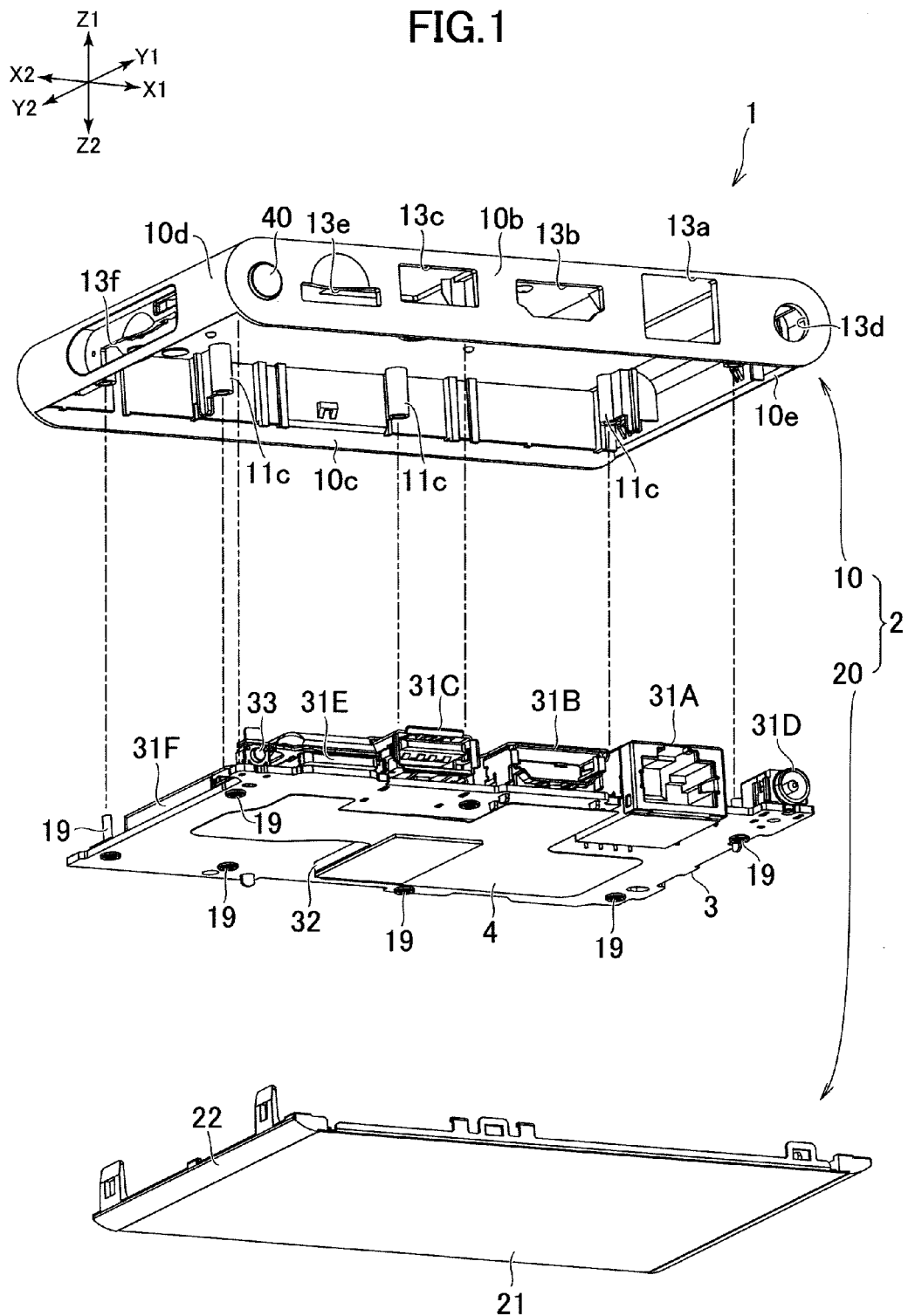
FIG. 1 is an exploded perspective view of electronic apparatus according to an embodiment of the present disclosure.
Figure 2:
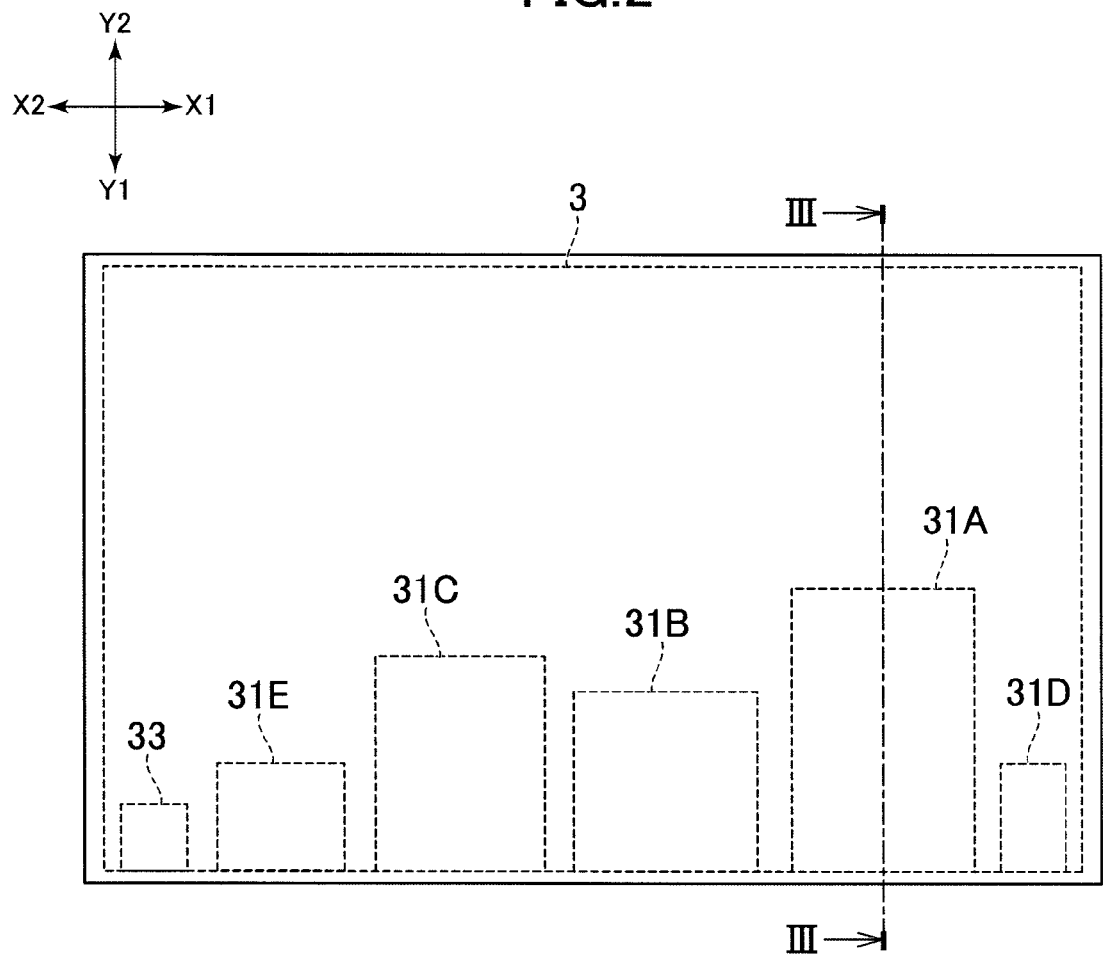
FIG. 2 is a plan view of the electronic apparatus.

One embodiment of the present disclosure will be described below with reference to the drawings. FIG. 1 is an exploded perspective view of electronic apparatus 1 according to the embodiment of the present disclosure. FIG. 2 is a plan view of the electronic apparatus 1. In the following description, X1 and X2 shown in FIG. 1 are defined as the right direction and the left direction, respectively. Furthermore, Y1 and Y2 are defined as the forward direction and the rearward direction, respectively, and Z1 and Z2 are defined as the upward direction and the downward direction, respectively. Directions mentioned in the following description indicate the relative positional relationships among the respective members and parts and do not indicate absolute directions.

As shown in FIG. 1, the electronic apparatus 1 has a housing 2 and a circuit board 3 housed in the housing 2. On the circuit board 3, one or plural integral circuits that function as arithmetic device, storage device, image processing device, wireless communication module, etc. are mounted (in FIG. 1, one integrated circuit 32 is shown as an example).

The electronic apparatus 1 is apparatus that functions as e.g. a game device. To the electronic apparatus 1 of the example described here, a display device such as a television and an operation device operated by a user are each connected in a wired or wireless manner. The electronic apparatus 1 executes a program recorded in a portable recording medium such as a memory card or a program received via a network and outputs an image signal according to operation by the user to the display device. The electronic apparatus 1 is not limited to the game device. For example, the electronic apparatus 1 may be a mobile phone, tablet terminal, camera, portable personal computer, or the like.

Figure 3:
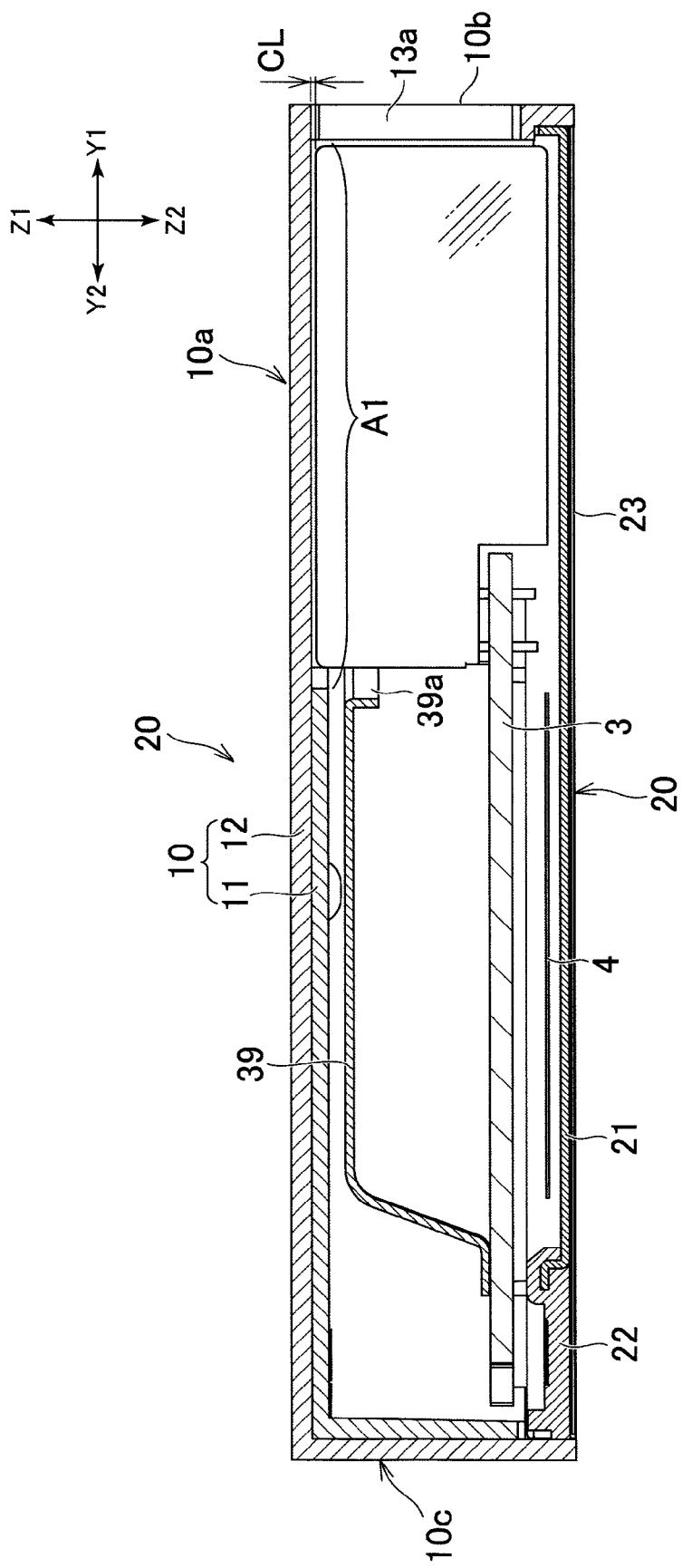
FIG. 3 is a sectional view along line III-III shown in FIG. 2.

Besides the integrated circuit, various components are mounted on the circuit board 3. Connectors for connecting cables to link external devices to the electronic apparatus 1 are mounted on the circuit board 3. As shown in FIG. 3, plural connectors 31A, 31B, 31C, and 31D are mounted on the circuit board 3 of the example described here. For example, the connector 31A is a connector for connecting an Ethernet (registered trademark) cable. The connector 31B is a connector for connecting e.g. an HDMI (High-Definition Multimedia Interface) (registered trademark) cable and is used for a connection of a display device such as a television and the electronic apparatus 1. The connector 31C is a USB connector and the connector 31D is a connector for a power cable. The kinds of connectors 31A to 31D are not limited thereto and may be arbitrarily changed depending on functions desired for the electronic apparatus 1. Furthermore, a slot for accepting a memory card is mounted on the circuit board 3. On the circuit board 3 of the example described here, plural (specifically, two) slots 31E and 31F for each accepting a respective one of different kinds of cards are mounted. If the electronic apparatus 1 is a game machine, in the slots 31E and 31F, e.g. a memory card in which a game program is stored and a memory card for holding various data acquired via a network are inserted. In the example described here, the connectors 31A to 31D and the slot 31E are lined along the front edge of the circuit board 3. The slot 31F is provided at the left edge of the circuit board 3.

As shown in FIG. 1, the housing 2 has a first exterior member 10 and a second exterior member 20. In the example described here, the first exterior member 10 has a box shape whose lower side is opened and the second exterior member 20 has a substantially plate shape. The second exterior member 20 is attached to the first exterior member 10 in such a manner as to close the lower side of the first exterior member 10, and forms the housing 2 together with the first exterior member 10 through this. The first exterior member 10 covers the upper side of the circuit board 3 and the second exterior member 20 covers the lower side of the circuit board 3.

[Double-Layer Structure of Housing]

Figure 4:
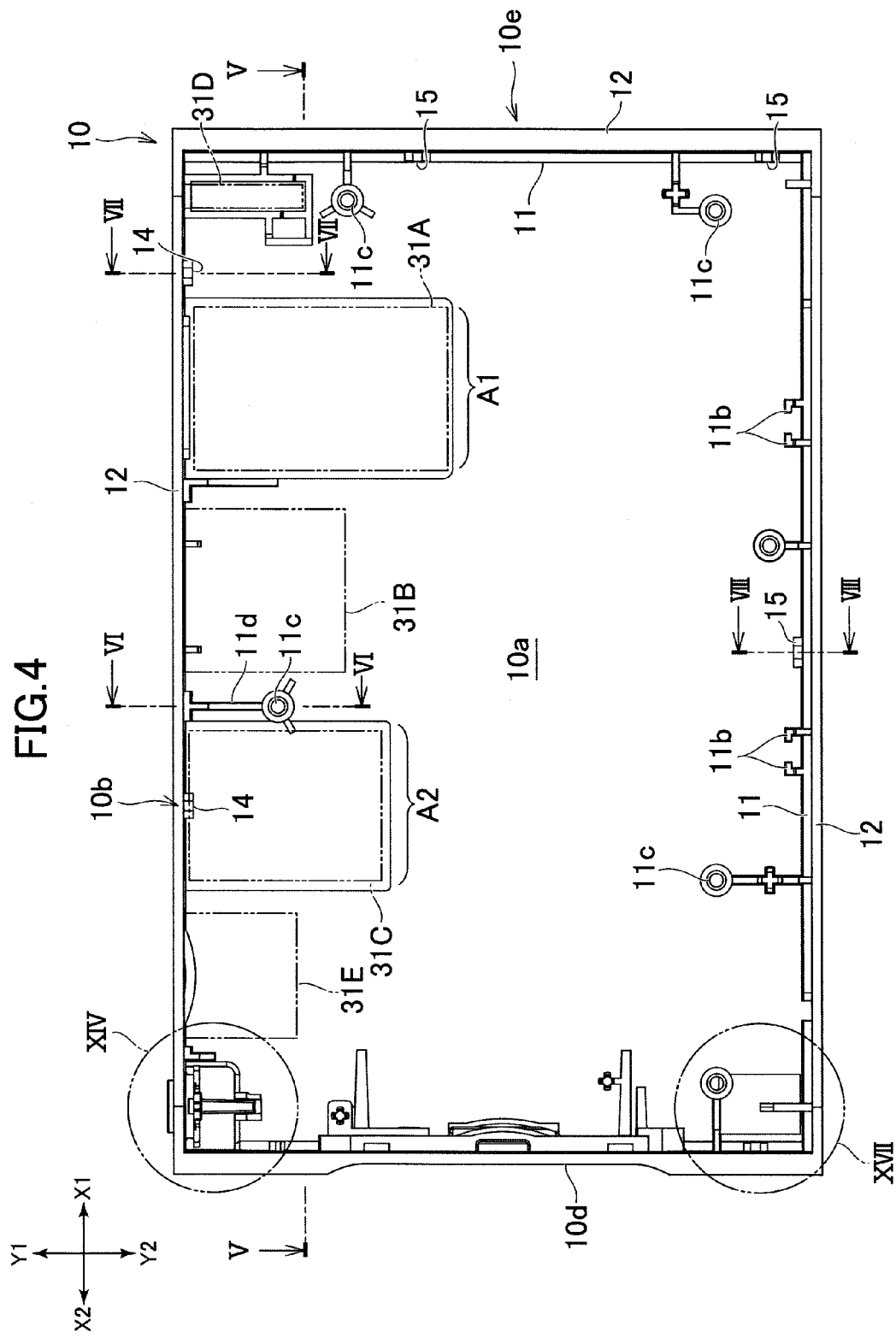
FIG. 4 is a diagram showing the inner surface of a first exterior member.
Figure 5:
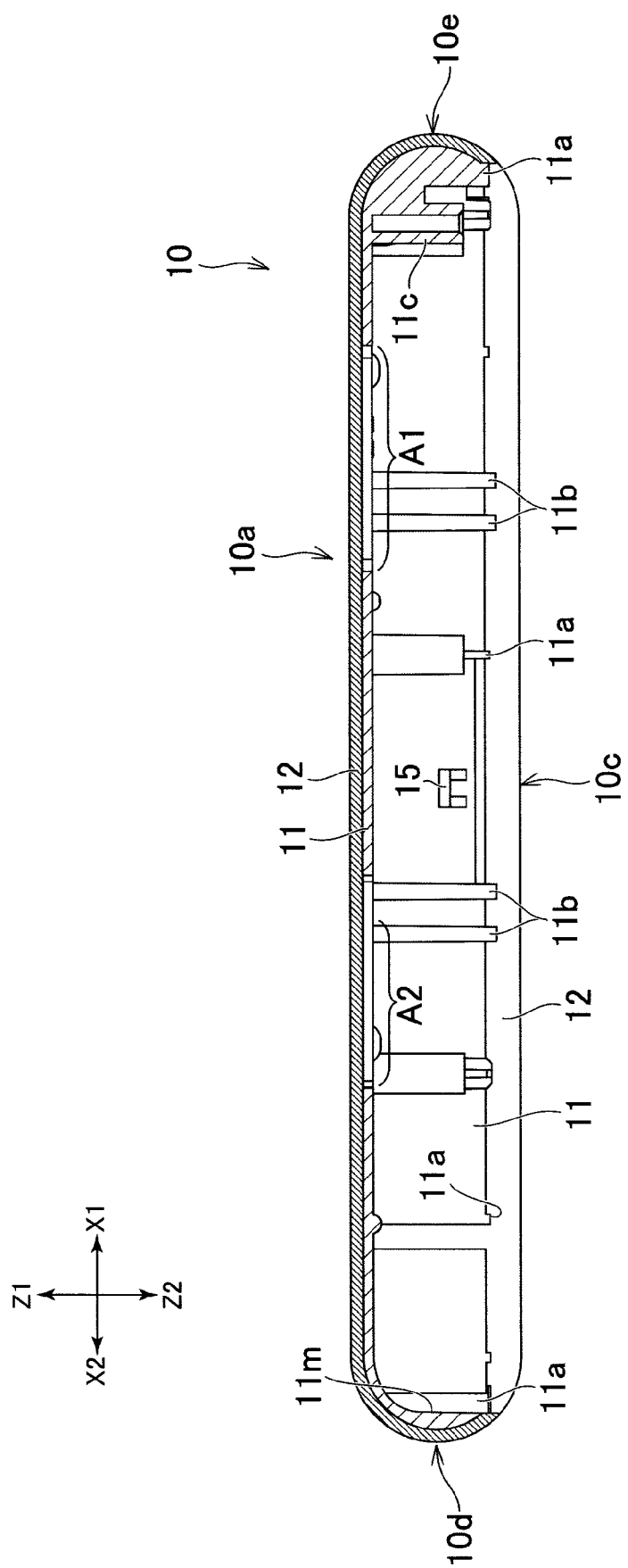
FIG. 5 is a sectional view along line V-V shown in FIG. 4.
Figure 6:
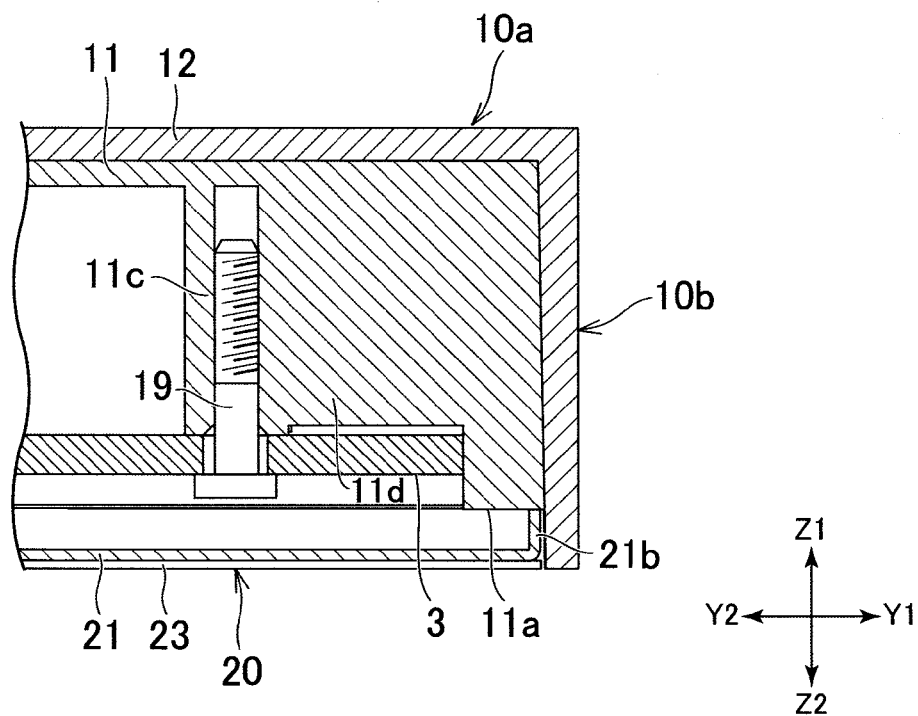
FIG. 6 is a sectional view of the electronic apparatus obtained at a cut plane shown by line VI-VI in FIG. 4.
Figure 7:
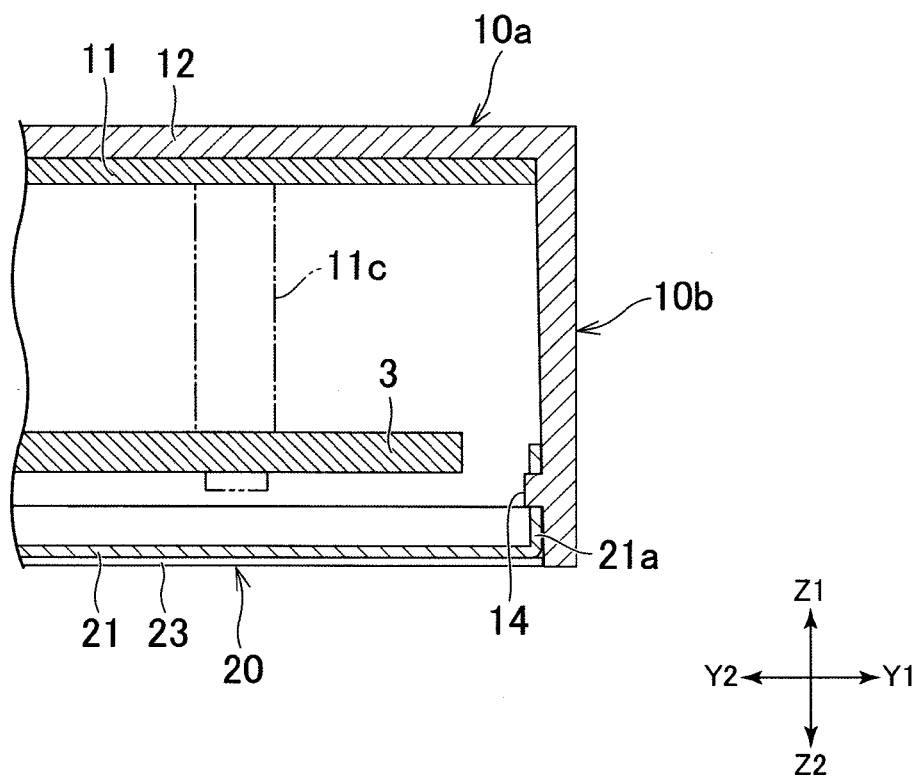
FIG. 7 is a sectional view of the electronic apparatus obtained at a cut plane shown by line VII-VII in FIG. 4.
Figure 8:
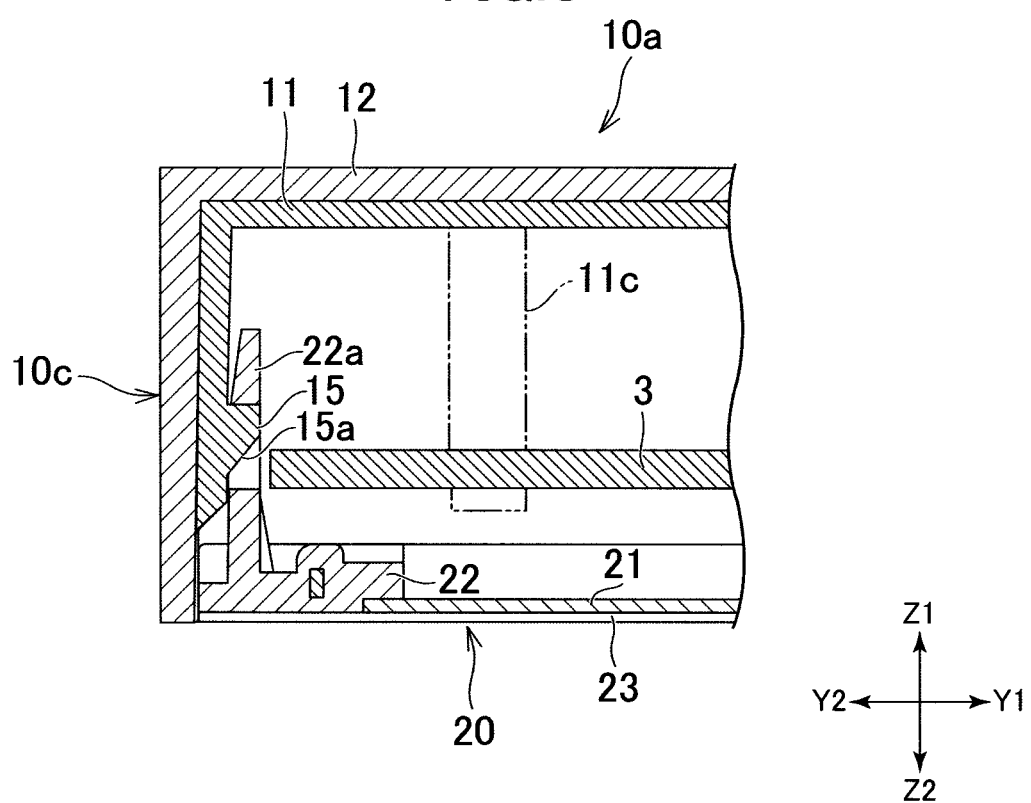
FIG. 8 is a sectional view of the electronic apparatus obtained at a cut plane shown by line VIII-VIII in FIG. 4.

FIG. 3 is a sectional view along line III-III shown in FIG. 2. FIG. 4 is a diagram showing the inner surface of the first exterior member 10. FIG. 5 is a sectional view along line V-V shown in FIG. 4. FIGS. 6 to 8 are sectional views of the electronic apparatus 1. FIG. 6 is a sectional view obtained at a cut plane shown by line VI-VI in FIG. 4. FIG. 7 is a sectional view obtained at a cut plane shown by line VII-VII in FIG. 4. FIG. 8 is a sectional view obtained at a cut plane shown by line VIII-VIII in FIG. 4.

The first exterior member 10 has a double-layer structure. Specifically, as shown in FIG. 3, the first exterior member 10 has an inner layer portion 11 forming the inner surface of the housing 2 and an outer layer portion 12 forming the outer surface of the housing 2. In the example described here, the inner layer portion 11 and the outer layer portion 12 are formed by two-color molding (double molding) of resin. In the two-color molding, for example, one layer portion (in the example described here, the inner layer portion 11) is molded by using a primary mold. Thereafter, the layer portion formed first is disposed on a secondary mold and the other layer portion (in the example described here, the outer layer portion 12) is so molded as to overlap with the one layer portion. The outer layer portion 12 does not necessarily have to form the outer surface of the electronic apparatus 1. That is, a panel, film, sheet, etc. for ornament may be further attached to the outer surface of the outer layer portion 12.

The inner surface of the first exterior member 10, i.e. the inner surface of the housing 2, has a region in which the inner layer portion 11 is not formed or the thickness of the inner layer portion 11 is smaller than in the other region, and a component is disposed in this region. In the example shown in FIGS. 3 and 4, the inner surface of the first exterior member 10 has a region A1 in which the inner layer portion 11 is not formed. The thickness of the outer layer portion 12 is even between the region A1 and the periphery thereof. The first exterior member 10 of the example described here has a box shape whose lower side is opened as described above, and has an upper wall part 10a and peripheral wall parts (a front wall part 10b, a rear wall part 10c, a left wall part 10d, and a right wall part 10e) surrounding the upper wall part 10a. The region A1 is set on the lower surface of the upper wall part 10a.

The component disposed in the region A1 is a component thicker than the integrated circuit in one example. Specifically, the component disposed in the region A1 is the thickest component among the components attached to the circuit board 3. That is, the component disposed in the region A1 is a component having the largest height in the thickness direction of the circuit board 3 (vertical direction). As shown in FIG. 3, the connector 31A is disposed in the region A1 in the example described here. The region A1 has a size corresponding to the connector 31A in plan view (see FIG. 4). The number of such regions is not limited to one. As such a region in which a component is disposed, plural regions may be set on the inner surface of the housing 2. In this case, both of a region in which the inner layer portion 11 is not formed and a region in which the inner layer portion 11 is thin may be set on the inner surface of the housing 2.

This structure of the first exterior member 10 allows size reduction of the electronic apparatus 1. Specifically, the width of the electronic apparatus 1 in the vertical direction can be reduced. Furthermore, the thickness of the outer layer portion 12 can be made even, which can suppress generation of irregularities in the outer surface of the housing 2 attributed to sink marks of resin in the molding. Moreover, because the thickness of the first exterior member 10 is not wholly reduced, the rigidity of the first exterior member 10 can be ensured. In the example described here, the first exterior member 10 has the inner layer portion 11 at its large part. Specifically, the first exterior member 10 has the inner layer portion 11 at the part other than the region A1, a region A2 to be described later, and the front wall part 10b.

The material of the outer layer portion 12 and the material of the inner layer portion 11 are different from each other. By forming the first exterior member 10 from two materials having different natures, advantages of the two materials can be utilized. For example, the inner layer portion 11 is formed by a resin that has lower hardness (that is softer) than the outer layer portion 12. This can increase the strength against an external force acting on the first exterior member 10 (e.g. force pressing the upper side of the first exterior member 10) with suppression of formation of scratches and so forth on the surface of the first exterior member 10. The outer layer portion 12 is formed of e.g. ABS (Acrylonitrile-Butadiene-Styrene) resin and the inner layer portion 11 is formed of polycarbonate. The outer layer portion 12 and the inner layer portion 11 may be formed of the same material.

As shown in FIG. 3, in the example described here, the distance CL between the upper surface of the connector 31A (surface on the side of the first exterior member 10) and the outer layer portion 12 is smaller than the thickness of the inner layer portion 11. In other words, the upper part of the connector 31A is disposed in a recess of the first exterior member 10 generated due to that the inner layer portion 11 is not formed. This can achieve further size reduction of the electronic apparatus 1. The position of the component disposed in the region A1 is not necessarily limited thereto. For example, if it is preferable that the component disposed in the region A1 has a comparatively long distance from the outer layer portion 12, the distance between this component and the outer layer portion 12 may be larger than the thickness of the inner layer portion 11.

The component disposed in the region A1 does not have to be a connector. For example, if the electronic apparatus 1 includes a battery and the battery is thicker than the other components, the region A1 may be set at a position corresponding to the battery. Furthermore, the component disposed in the region A1 does not necessarily have to be a component mounted on the circuit board 3 or a component electrically connected to the circuit board 3.

As shown in FIG. 3, a chassis 39 that is a metal plate is attached to one surface of the circuit board 3 (surface on the side of the first exterior member 10). The chassis 39 covers components (e.g. integrated circuit) mounted on the circuit board 3. The chassis 39 is so formed as to keep away from the connector 31A. Specifically, the chassis 39 has an opening 39a at the position of the connector 31A. The upper part of the connector 31A is located on the upper side relative to the chassis 39 and its upper surface is opposed to the outer layer portion 12. Due to such a shape of the chassis 39, the distance between the upper surface of the connector 31A and the outer layer portion 12 can be set smaller than the thickness of the inner layer portion 11.

As shown in FIGS. 4 and 5, the inner surface of the first exterior member 10 of the example described here, specifically the lower surface of the upper wall part 10a, has a region A2 in addition to the region A1. The region A2 is a region in which the inner layer portion 11 is not formed or the inner layer portion 11 is thinner than at the other part as with the region A1. The inner layer portion 11 is not formed in the region A2 of the example described here. The connector 31C is disposed in the region A2. The connector 31C is thicker than the connectors other than the connector 31A, i.e. the two connectors 31B and 31D, and the slots 31E and 31F. That is, the connector 31C has a larger height in the thickness direction of the circuit board 3 than the components 31B, 31D, 31E, and 31F.

The distance between the upper surface of the connector 31C (surface on the side of the first exterior member 10) and the outer layer portion 12 is smaller than the thickness of the inner layer portion 11 similarly to the connector 31A for example. This can achieve further size reduction of the electronic apparatus 1. Furthermore, a force in the vertical direction often acts on the connector 31C when a user connects a cable to the connector 31C. The upward movement of the connector 31C due to this force can be suppressed by the outer layer portion 12. The position of the component disposed in the region A2 is not necessarily limited thereto. For example, if it is preferable that the component disposed in the region A2 has a comparatively long distance from the outer layer portion 12, the distance between this component and the outer layer portion 12 may be larger than the thickness of the inner layer portion 11.

Between the two components disposed in the two regions A1 and A2, another component having a lower height than these two components is disposed. Furthermore, the inner layer portion 11 is formed at the position corresponding to this another component differently from the regions A1 and A2. This makes it easier to keep the rigidity of the first exterior member 10 compared with a case in which the regions A1 and A2 are continuous for example. In the example described here, as shown in FIG. 4, the connector 31B having a lower height than the connectors 31A and 31C is disposed between them. The component disposed between the connectors 31A and 31C does not necessarily have to be a connector.

As described above, the first exterior member 10 has the upper wall part 10a and the rear wall part 10c connected to the rear edge of the upper wall part 10a. As shown in FIG. 3, the upper wall part 10a and the rear wall part 10c each have the above-described outer layer portion 12 and inner layer portion 11. Specifically, in the inner surface (lower surface) of the upper wall part 10a, the part except the regions A1 and A2 is formed of the two layer portions 11 and 12. The rear wall part 10c has the inner layer portion 11 and the outer layer portion 12 over its whole region. That is, in the rear wall part 10c, the inner layer portion 11 is formed over the region from the left end part of the rear wall part 10c to the right end part. Because two wall parts have the double-layer structure in this manner, the strength of the first exterior member 10 can be increased.

The first exterior member 10 has the front wall part 10b connected to the front edge of the upper wall part 10a as described above. In the front wall part 10b, openings 13a to 13d into which to insert cables connected to the connectors 31A to 31D are formed (see FIG. 1). Furthermore, an opening 13e for exposing the slot 31E is formed in the front wall part 10b.

As shown in FIG. 3, the front wall part 10b has the outer layer portion 12. The inner surface (rear surface) of the front wall part 10b does not have the inner layer portion 11 at the part opposed to the connector 31A. Therefore, the outer layer portion 12 is exposed at this part and the front end of the connector 31A and the outer layer portion 12 of the front wall part 10b directly face each other. This brings the position of the connector 31A close to the opening 13a, which makes it easy for a user to connect a cable to the connector 31A. Furthermore, the space occupied by the connector 31A in the space inside the housing 2 can be decreased and thus the layout of components other than the connector 31A can be made easy.

In the example described here, as shown in FIGS. 4 and 6, a rib 11d formed monolithically with the inner layer portion 11 is formed at the front wall part 10b, whereas the inner layer portion 11 is not formed on the inner surface of the front wall part 10b. Therefore, not only the connector 31A but also the connectors 31B to 31D are directly opposed to the outer layer portion 12 of the front wall part 10b. This makes it easy to connect a cable to these connectors 31B to 31D. Similarly, the slot 31E is also directly opposed to the outer layer portion 12 of the front wall part 10b. This makes it easy to insert a memory card into the slot 31E. Furthermore, the space occupied by the connectors 31B to 31D in the space inside the housing 2 can be decreased and thus the layout of components other than these components can be made easy.

The first exterior member 10 further has the right wall part 10e and the left wall part 10d connected to the right edge and left edge, respectively, of the upper wall part 10a as described above. As shown in FIGS. 4 and 5, each of the right wall part 10e and the left wall part 10d has the above-described outer layer portion 12 and inner layer portion 11. Because the right wall part 10e and the left wall part 10d also have the double-layer structure in this manner, the strength of the first exterior member 10 can be further increased.

In the example described here, the outer surface of the left wall part 10d (side surface of the first exterior member 10) is curved in a circular arc manner. As shown in FIG. 5, an inner surface 11m of the inner layer portion 11 of the left wall part 10d is a substantially vertical surface. Therefore, in molding of the inner layer portion 11, the inner surface 11m of the inner layer portion 11 of the left wall part 10d can be formed by moving a mold in the vertical direction. This facilitates molding of the left wall part 10d. The outside surface of the inner layer portion 11 of the left wall part 10d (surface in contact with the outer layer portion 12) is curved in matching with the outer surface of the left wall part 10d (outer surface of the outer layer portion 12). The outer layer portion 12 is curved in a circular arc manner along the outside surface of the inner layer portion 11. In other words, the outer layer portion 12 is curved in a circular arc manner and the inner layer portion 11 is so formed as to fill the inside of the outer layer portion 12. Therefore, the thickness of the outer layer portion 12 of the left wall part 10d can be made even. This can suppress generation of sink marks of resin at the left wall part 10d.

These points are the same also in the right wall part 10e. Specifically, the inner surface of the inner layer portion 11 of the right wall part 10e is also a substantially vertical surface. Therefore, molding of the right wall part 10e is also easy. Furthermore, the outside surface of the inner layer portion 11 of the right wall part 10e (surface in contact with the outer layer portion 12) is curved in matching with the outer surface of the right wall part 10e (outer surface of the outer layer portion 12). Therefore, the thickness of the outer layer portion 12 of the right wall part 10e can be made even.

As shown in FIG. 1, the circuit board 3 is attached to the first exterior member 10 by plural screws 19. The first exterior member 10 has plural cylindrical attachment protrusions 11c to each of which a respective one of the plural screws 19 is attached. As shown in FIGS. 5 and 6, the attachment protrusion 11c is molded monolithically with the inner layer portion 11. This can suppress generation of sink marks of resin in the outer surface of the first exterior member 10 attributed to the attachment protrusions 11c.

Furthermore, as described above, the inner surface of the inner layer portion 11 of the right wall part 10e is vertical and can be formed by moving a mold in the vertical direction. This allows the attachment protrusion 11c to be formed near the right wall part 10e as shown in FIG. 5. Specifically, if the inner surface of the inner layer portion 11 of the right wall part 10e is curved, the mold needs to be slid toward the inside of the first exterior member 10 to form the inner surface of the inner layer portion 11 of the right wall part 10e. In this case, a space for permitting the slide of the mold is necessary between the attachment protrusion 11c and the inner layer portion 11 of the right wall part 10e and therefore it is difficult to form the attachment protrusion 11c near the right wall part 10e. In the example described here, because the inner surface of the inner layer portion 11 of the right wall part 10e can be formed by moving the mold in the vertical direction, such a space is unnecessary and the distance between the attachment protrusion 11c and the inner surface of the inner layer portion 11 of the right wall part 10e can be decreased.

[Assembling Structure of First Exterior Member and Second Exterior Member]

Figure 9:
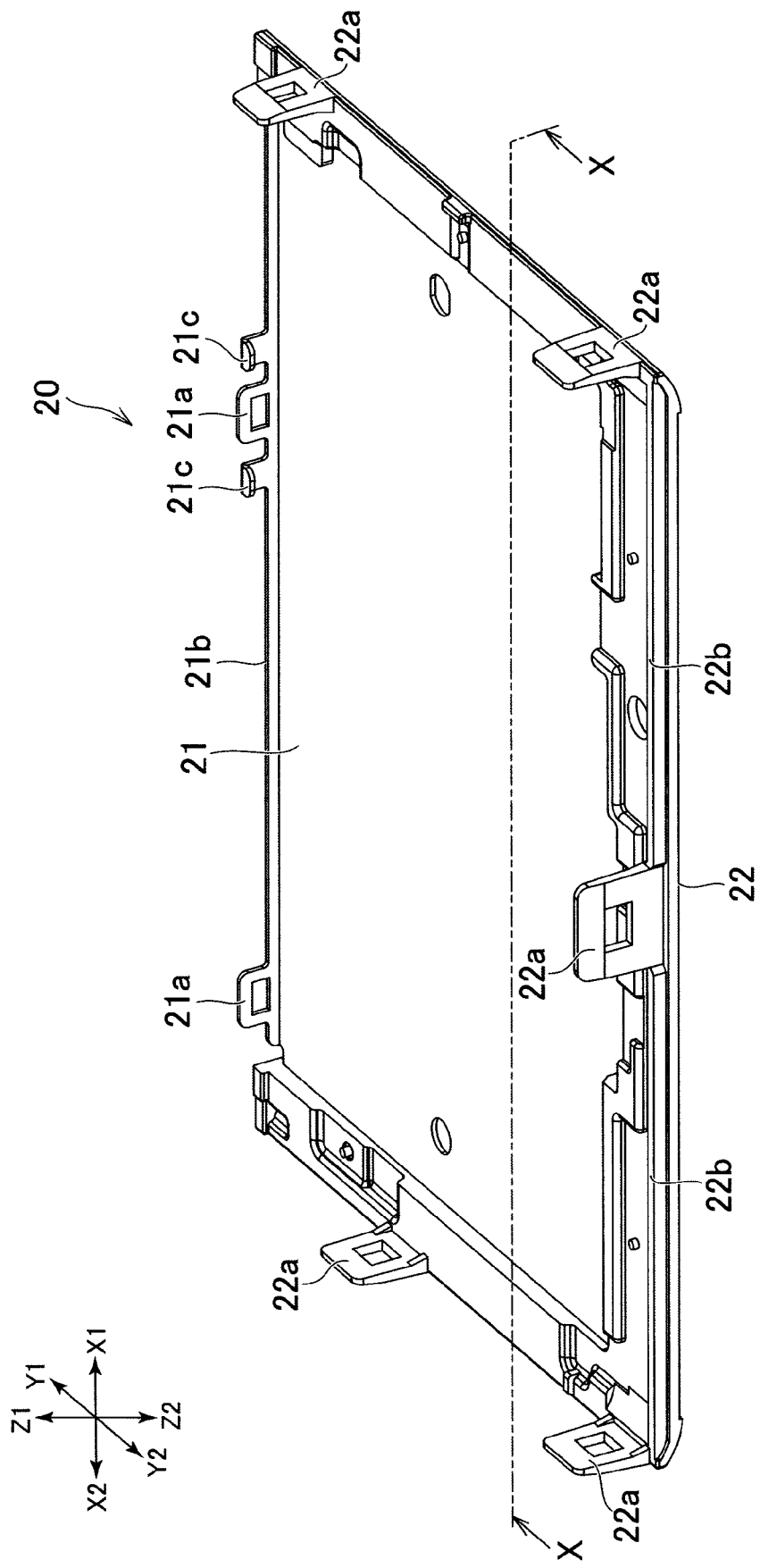
FIG. 9 is a perspective view showing the inner surface of a second exterior member.
Figure 10:
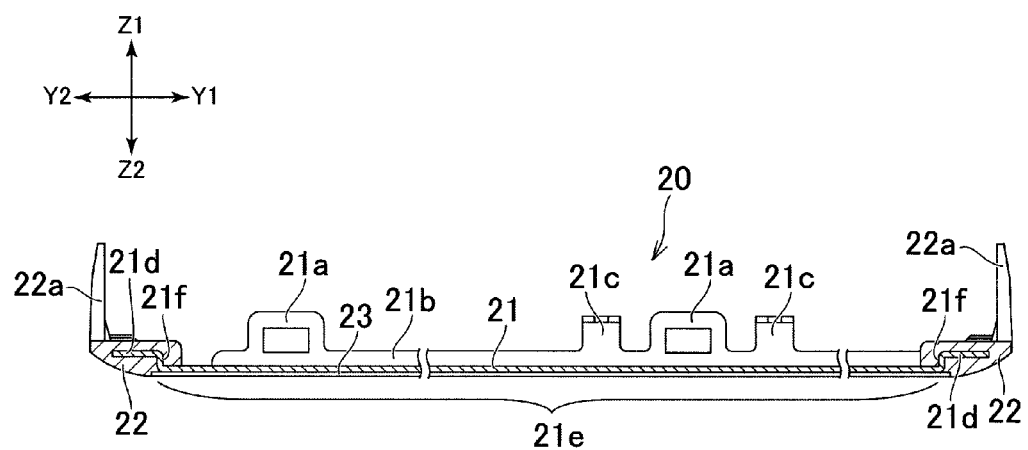
FIG. 10 is a sectional view along line X-X shown in FIG. 9.
Figure 11:
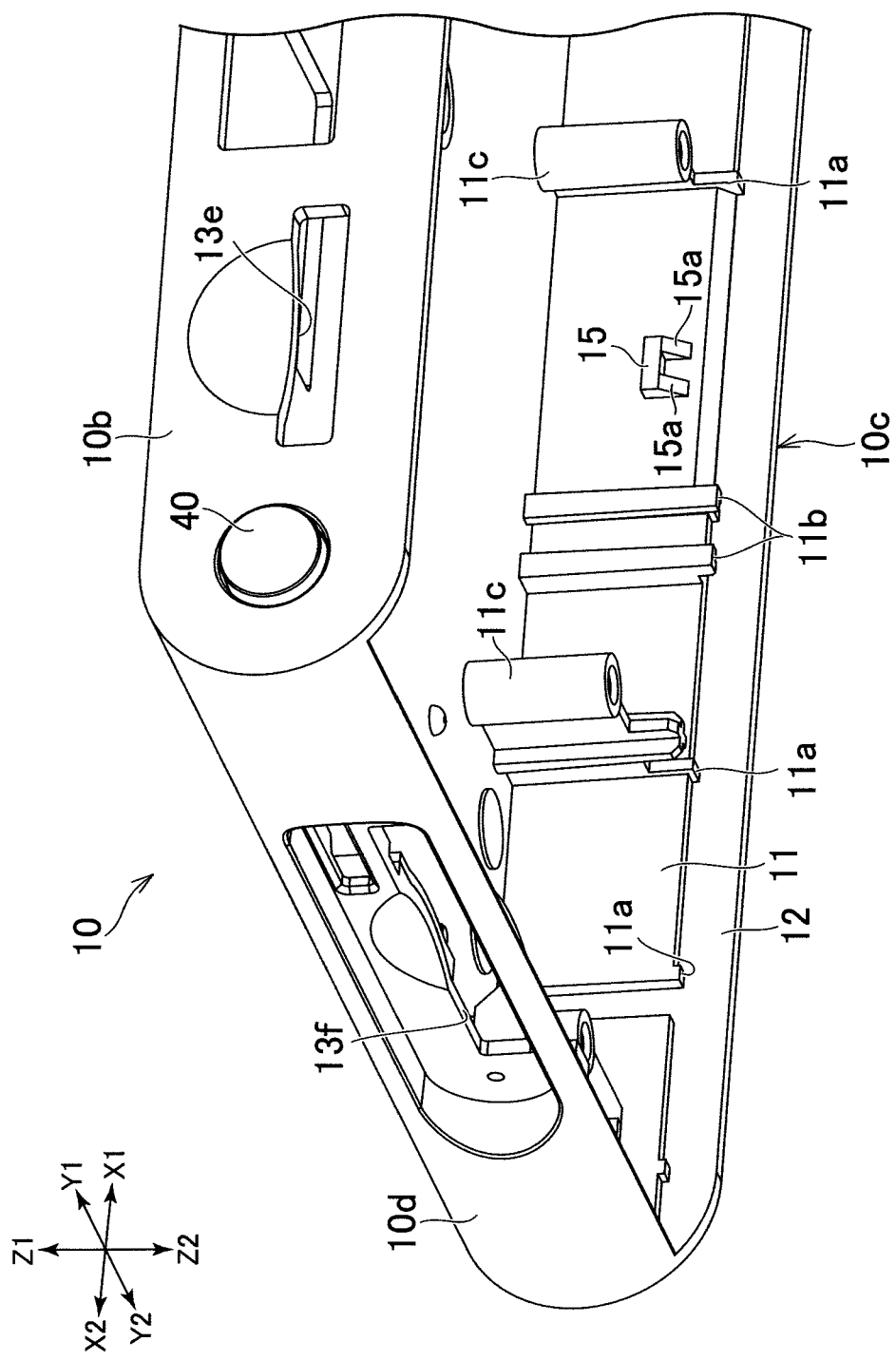
FIG. 11 is an enlarged perspective view of the first exterior member.

FIG. 9 is a perspective view showing the inner surface (upper surface) of the second exterior member 20. FIG. 10 is a sectional view along line X-X shown in FIG. 9. FIG. 11 is an enlarged perspective view of the first exterior member 10.

The second exterior member 20 of the example described here has a substantially plate shape. As shown in FIG. 10, the second exterior member 20 has a metal plate 21. By using the metal plate 21 for the second exterior member 20, the thickness of the second exterior member 20 can be reduced with ensuring of the rigidity of the second exterior member 20. As a result, size reduction of the electronic apparatus 1 can be achieved. In the example described here, as shown in FIG. 3, the metal plate 21 is thinner than the first exterior member 10. Specifically, the metal plate 21 is thinner than the inner layer portion 11 of the first exterior member 10. Furthermore, the metal plate 21 is thinner than the outer layer portion 12 of the first exterior member 10. An insulating film 23 is stuck to a surface (lower surface) of the metal plate 21. The film 23 does not necessarily have to be provided.

As shown in FIG. 10, the second exterior member 20 has a resin portion 22 formed at a peripheral part 21d of the metal plate 21. As described in detail later, the resin portion 22 is formed at the peripheral part 21d of the metal plate 21 by insert molding. Specifically, the peripheral part 21d of the metal plate 21 is buried in the resin portion 22. The resin portion 22 is fixed to the peripheral part 21d without using a fixing component such as a screw. In the example described here, the resin portion 22 is formed only at the peripheral part 21d of the metal plate 21 and the part inside the peripheral part 21d (plate main body 21e) is not covered by the resin portion 22. This allows the reduction in the thickness of the second exterior member 20. The material of the resin portion 22 is e.g. ABS resin or polycarbonate as with the first exterior member 10.

Plural engaged parts 14 and 15 are formed on the inner surface of the first exterior member 10 (see FIGS. 7 and 11). The engaged parts 14 and 15 of the example described here are protrusions that protrude inward. The engaged parts 14 are formed on the inner surface of the front wall part 10b of the first exterior member 10. The engaged parts 15 are formed at the rear wall part 10c, the left wall part 10d, and the right wall part 10e of the first exterior member 10. As shown in FIG. 9, engagement parts 21a and 22a are formed in the second exterior member 20. The engagement parts 21a and 22a engage with the engaged parts 14 and 15, respectively, of the first exterior member 10 to assemble the second exterior member 20 to the first exterior member 10. The engagement parts 21a are formed monolithically with the metal plate 21. Therefore, the engagement parts 21a are formed of a metal. The engagement parts 22a are molded monolithically with the resin portion 22. Therefore, the engagement parts 22a are formed of a resin. The engagement parts 22a are elastically deformable and are elastically deformed in the process of assembling the second exterior member 20 to the first exterior member 10, i.e. in the process of engaging the engagement parts 22a with the engaged parts 15.

By providing the resin portion 22 at the peripheral part 21d of the metal plate 21 and forming the engagement parts 22a on this resin portion 22 in this manner, easy assembling of the second exterior member 20 to the first exterior member 10 is enabled. Specifically, to assemble the second exterior member 20 to the first exterior member 10 without using a fixing component such as a screw, an engagement part that engages with the first exterior member 10 should be formed in the second exterior member 20. If the second exterior member 20 is formed only of the metal plate 21 having high rigidity in the structure in which the two exterior members 10 and 20 are assembled by using the engagement part, it is difficult to assemble the second exterior member 20 to the first exterior member 10 because the engagement parts 21a formed on the metal plate 21 are difficult to deform. In the electronic apparatus 1, because the resin portion 22 is formed at the peripheral part 21d of the metal plate 21 and the elastically deformable engagement parts 22a are molded monolithically with this resin portion 22, the second exterior member 20 can be easily assembled to the first exterior member 10.

As shown in FIG. 9, the resin portion 22 is so formed as to surround the outer edge of the metal plate 21. The resin portion 22 of the example described here is formed at the rear edge and left and right edges of the metal plate 21. The part formed at the rear edge of the metal plate 21 and the parts formed at the left and right edges are connected to each other. This strongly fixes the resin portion 22 to the metal plate 21. The resin portion 22 is not provided at a front edge 21b of the metal plate 21 and the front edge 21b is exposed. The shape of the resin portion 22 is not limited thereto. For example, the resin portion 22 may be formed only at a position at which the engagement part 22a should be formed. That is, the resin portion 22 may be formed only at part of the rear edge of the metal plate 21 or part of the left and right edges. The resin portion 22 may be formed also at the front edge 21b of the metal plate 21.

As described above, in the front wall part 10b, the openings 13a to 13e for exposing the connectors 31A to 31D and the slot 31E are formed. Therefore, an external force readily acts on the front wall part 10b when a user connects a cable or inserts a memory card for example. As shown in FIG. 3, the second exterior member 20 is fitted to the inside of the peripheral wall parts of the first exterior member 10 (front wall part 10b, rear wall part 10c, left wall part 10d, and right wall part 10e). The front edge 21b of the metal plate 21 abuts against the inside of the front wall part 10b of the first exterior member 10. Because the metal plate 21 abuts against the inside of the front wall part 10b, on which an external force readily acts, in this manner, the strength of the front wall part 10b against the external force can be enhanced.

The front edge 21b of the metal plate 21 is bent upward as shown in FIG. 9. This can further enhance the rigidity of the metal plate 21 and increase the strength of the front edge 21b against a force acting on the front wall part 10b. Plural (in this example, two) protrusions 21c are formed on the front edge 21b. The protrusions 21c protrude from the front edge 21b further upward and are disposed along the front wall part 10b of the first exterior member 10. The protrusions 21c are disposed corresponding to the position of the connector 31C (see FIG. 1). This can suppress acting of a large burden on the connector 31C when a cable is connected to the connector 31C.

The resin portion 22 has the engagement parts 22a located on the opposite side to the engagement parts 21a of the metal plate 21 in the direction perpendicular to the assembling direction of the first exterior member 10 and the second exterior member 20. The first exterior member 10 and the second exterior member 20 of the example described here are assembled in the vertical direction. The resin portion 22 has the engagement parts 22a located on the opposite side to the engagement parts 21a in the front-rear direction. Specifically, as shown in FIG. 9, the engagement parts 21a are provided at the front edge of the metal plate 21 and the resin portion 22 has the engagement parts 22a located at the rear edge of the second exterior member 20. Therefore, in assembling the first exterior member 10 to the second exterior member 20, first the engagement parts 21a are engaged with the engaged parts 14 of the first exterior member 10 in a state in which the second exterior member 20 is inclined relative to the first exterior member 10. Then, the engagement parts 22a are engaged with the engaged parts 15. At this time, the engagement parts 22a are temporarily elastically deformed to engage with the engaged parts 15.

The engagement parts 22a are formed also at the right edge and left edge of the second exterior member 20. That is, the engagement parts 21a of the metal plate 21 are provided only at one of the four edges of the second exterior member 20 (front edge, rear edge, right edge, and left edge) and the engagement parts 22a monolithic with the resin portion 22 are formed at the remaining three edges. This allows increase in the number of engagement parts without causing difficulty in assembling of the second exterior member 20 and the first exterior member 10.

In the example described here, the engaged parts 14 and 15 of the first exterior member 10 are protrusions that protrude toward the inside of the first exterior member 10. Holes are formed in the engagement parts 21a and 22a of the second exterior member 20 (see FIG. 9) and the engaged parts 14 and 15 are fitted to these holes (see FIGS. 7 and 8). Slopes 15a are formed in the engaged parts 15 formed at the rear wall part 10c, the left wall part 10d, and the right wall part 10e of the first exterior member 10 (see FIGS. 8 and 11). In assembling the first exterior member 10 to the second exterior member 20, the engagement parts 22a of the second exterior member 20 are pushed by the slopes 15a to be inclined inward, which can facilitate the assembling work. The structure of the engaged parts 14 and 15 and the engagement parts 21a and 22a is not limited thereto. For example, the engagement part 22a may have a hook shape.

The second exterior member 20 is fitted to the inside of the peripheral wall parts of the first exterior member 10 (front wall part 10b, rear wall part 10c, left wall part 10d, and right wall part 10e). On the inner surfaces of the peripheral wall parts, support parts for supporting the second exterior member 20, i.e. for preventing the sinking of the second exterior member 20, are formed. In the example described here, the support parts are molded monolithically with the inner layer portion 11 included in the first exterior member 10. For example, as shown in FIG. 11, plural support ribs 11a are formed monolithically with the inner layer portion 11 at the rear wall part 10c. The lower ends of the supports ribs 11a are located at positions higher than the lower end of the outer layer portion 12. The rear edge of the second exterior member 20 is supported by the lower ends of the support ribs 11a. That is, the sinking of the second exterior member 20 is suppressed. Similarly, as shown in FIGS. 5 and 6, the plural support ribs 11a are formed monolithically with the inner layer portion 11 at the front wall part 10b, the left wall part 10d, and the right wall part 10e. The lower ends of the support ribs 11a are located at positions higher than the lower end of the outer layer portion 12. The front edge, left edge, and right edge of the second exterior member 20 are each supported by the lower ends of the support ribs 11a.

As shown in FIG. 9, ribs 22b extending along the left-right direction are formed at the rear edge of the second exterior member 20 (rear edge of the resin portion 22). As shown in FIG. 11, protrusions 11b are formed at the rear wall part 10c of the first exterior member 10. The rib 22b of the second exterior member 20 is disposed between the protrusion 11b and the rear wall part 10c of the first exterior member 10. This can suppress generation of a gap between the rear edge of the second exterior member 20 and the rear wall part 10c of the first exterior member 10. In the example described here, the protrusions 11b are molded monolithically with the inner layer portion 11. The rib 22b of the second exterior member 20 is sandwiched between the protrusion 11b of the inner layer portion 11 and the outer layer portion 12. By forming the protrusions 11b on the inner layer portion 11 in this manner, generation of subtle irregularities (sink marks of resin) in the outer surface of the first exterior member 10 attributed to the protrusions 11b can be suppressed.

In the example described here, in assembling the second exterior member 20 to the first exterior member 10, the engagement parts 21a at the front edge of the metal plate 21 are engaged with the engaged parts 14 of the first exterior member 10 in a state in which the second exterior member 20 is inclined. Thereafter, the engagement parts 22a of the resin portion 22 are engaged with the engaged parts 15 of the first exterior member 10. Therefore, at the front wall part 10*b* of the first exterior member 10, a part equivalent to the protrusion 11*b* of the rear wall part 10*c* is not formed. Specifically, if a part equivalent to the protrusion 11*b* is formed at the front wall part 10*b*, there is a fear that the engagement parts 21*a* of the metal plate 21 interfere with the protrusion 11*b* of the front wall part 10*b* and the assembling work of the second exterior member 20 and the first exterior member 10 is not smoothly performed. Therefore, in the example described here, a part equivalent to the protrusion 11*b* of the rear wall part 10*c* is not formed at the front wall part 10*b* of the first exterior member 10.

As shown in FIG. 6, at the front wall part 10*b* of the first exterior member 10, the inner layer portion 11 has a rib 11*d* extending from the support rib 11*a*, which supports the second exterior member 20, toward the attachment protrusion 11*c*. The circuit board 3 is attached to the attachment protrusion 11*c* and the attachment protrusion 11*c* is connected to the outer layer portion 12 of the front wall part 10*b* via the ribs 11*d* and 11*a*. This can suppress the forward expansion of the front wall part 10*b*, i.e. generation of a gap between the front wall part 10*b* and the front edge of the second exterior member 20. The attachment protrusion 11*c* shown in FIG. 6 is located between the connector 31C (in the example described here, USB connector) and the connector 31B (in the example described here, connector for HDMI (registered trademark) cable). This can suppress the bending of the circuit board 3 near the connectors 31C and 31B. As a result, the stability of the electrical connection between the connectors 31C and 31B and the circuit board 3 can be enhanced.

As shown in FIG. 1, a shield 4 is provided on the lower surface of the circuit board 3. The shield 4 is a metal plate and functions as a component for a countermeasure against electromagnetic radiation and/or for heat release. The metal plate 21 of the second exterior member 20 is electrically connected to this shield 4. For example, a plate spring is formed for the shield 4 and the metal plate 21 is electrically connected to the shield 4 via this plate spring.

As shown in FIG. 10, the resin portion 22 is so formed as to clamp the edge of the metal plate 21. In other words, the resin portion 22 covers the front side and back side of the peripheral part 21*d* of the metal plate 21. The metal plate 21 has the peripheral part 21*d* and the plate main body 21*e* as the part inside the peripheral part 21*d*. A step 21*f* is formed between the peripheral part 21*d* and the plate main body 21*e*. The peripheral part 21*d* and the step 21*f* are located inside the resin portion 22. Because the step 21*f* is also located inside the resin portion 22 in addition to the peripheral part 21*d* in this manner, the fixing between the resin portion 22 and the metal plate 21 is made stronger. The structure of the resin portion 22 is not limited thereto. For example, the resin portion 22 may be so formed as to cover only one of the front side and back side of the peripheral part 21*d* of the metal plate 21.

Figure 12A:
FIGS. 12A to 12C are schematic diagrams for explaining a manufacturing method of the second exterior member.
Figure 12B:
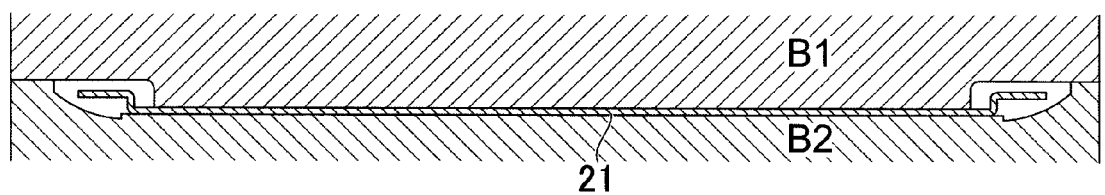
Figure 12C:
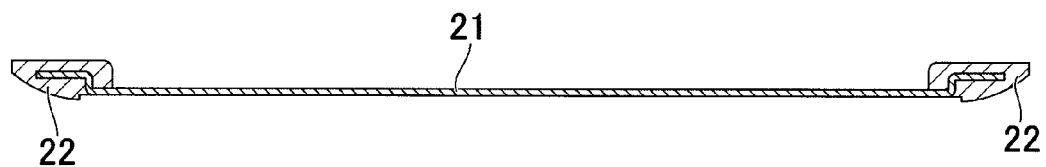

FIGS. 12A to 12C are schematic diagrams for explaining a manufacturing method of the electronic apparatus 1, specifically a manufacturing method of the second exterior member 20. As shown in FIG. 12A, the metal plate 21 for which sheet-metal processing has been executed is prepared. Specifically, the above-described step 21*f* and peripheral part 21*d* are formed by cut processing and bending processing. Then, as shown in FIG. 12B, the metal plate 21 is disposed in molds B1 and B2 and a molten resin is injected and poured into the inside of the molds B1 and B2 (insert molding). Thereby, as shown in FIG. 12C, the resin portion 22 is molded at the peripheral part 21*d* of the metal plate 21.

At this time, the above-described engagement parts 22*a* (not shown in FIGS. 12A to 12C) are also molded, so that the second exterior member 20 is obtained. The above-described engagement parts 21*a* of the metal plate 21 and the front edge 21*b* bent upward may be formed by bending processing and so forth before the insert molding or may be formed after the insert molding. After the forming of the second exterior member 20, the second exterior member 20 is assembled to the first exterior member 10 to which the circuit board 3 is fixed. Specifically, first the engagement parts 21*a* of the metal plate 21 are engaged with the engaged parts 14 of the first exterior member 10 in a state in which the second exterior member 20 is inclined. Thereafter, the engagement parts 22*a* of the resin portion 22 are engaged with the engaged parts 15 of the first exterior member 10. In this engagement process, the engagement parts 22*a* are temporarily elastically deformed.

[Structure of Button Member]

As shown in FIG. 1, the electronic apparatus 1 has a button member 40. The button member 40 is used as e.g. a power button of the electronic apparatus 1. The use form of the button member 40 is not limited thereto and may be arbitrarily changed.

Figure 13:
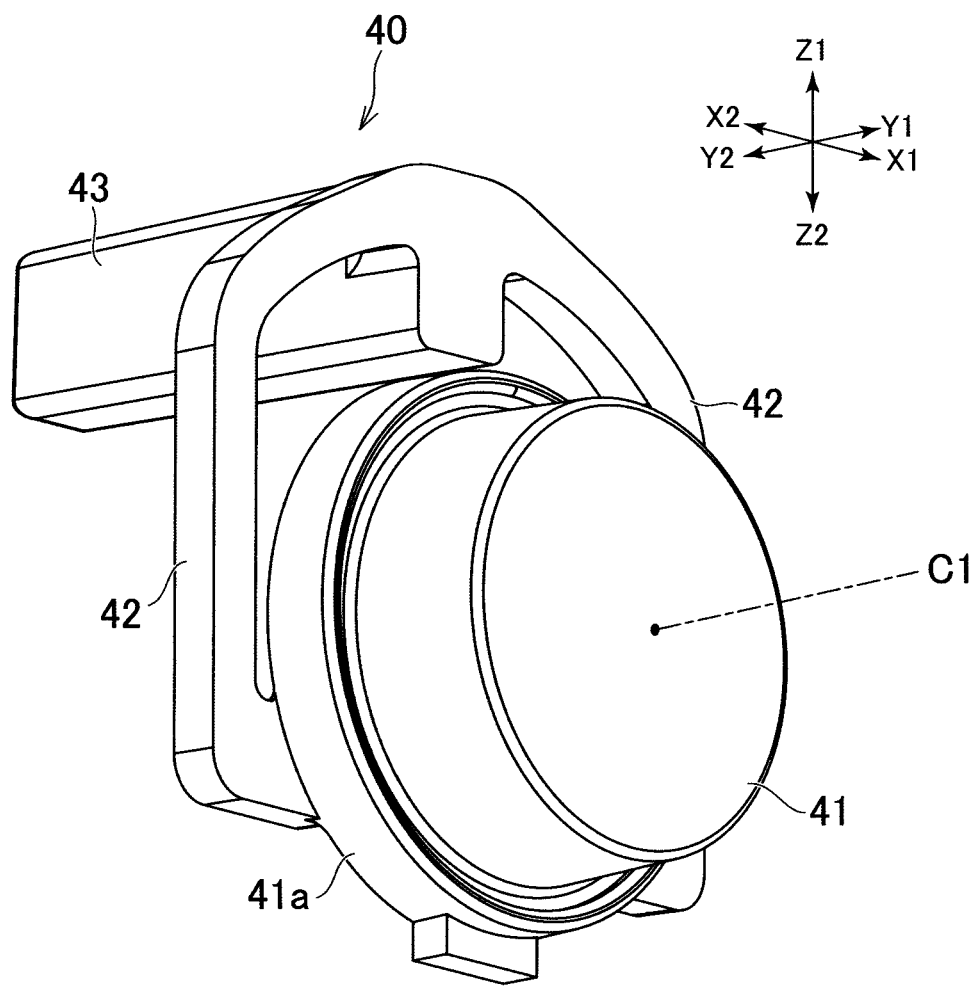
FIG. 13 is a perspective view of a button member.
Figure 14:
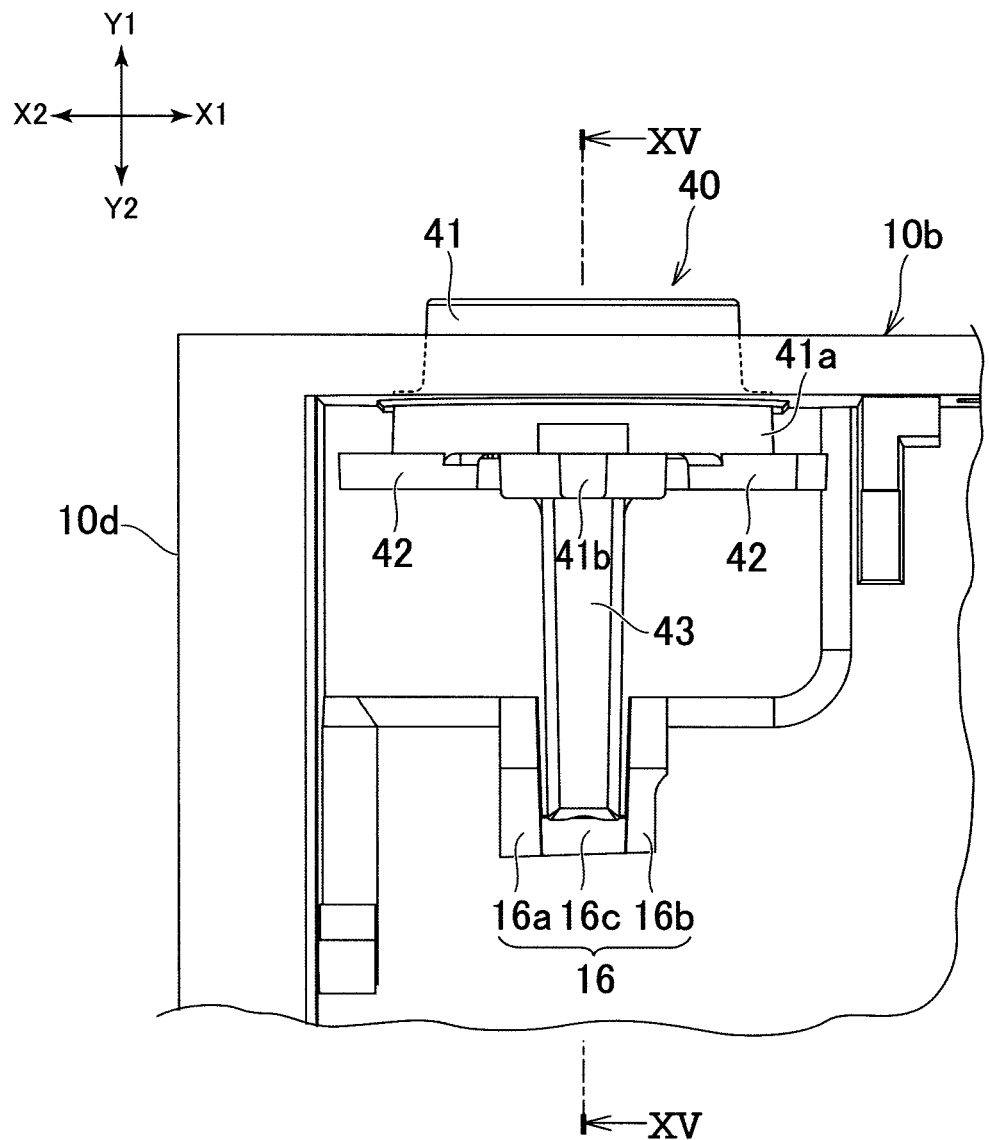
FIG. 14 is an enlarged view of a region shown by XIV in FIG. 4.
Figure 15:
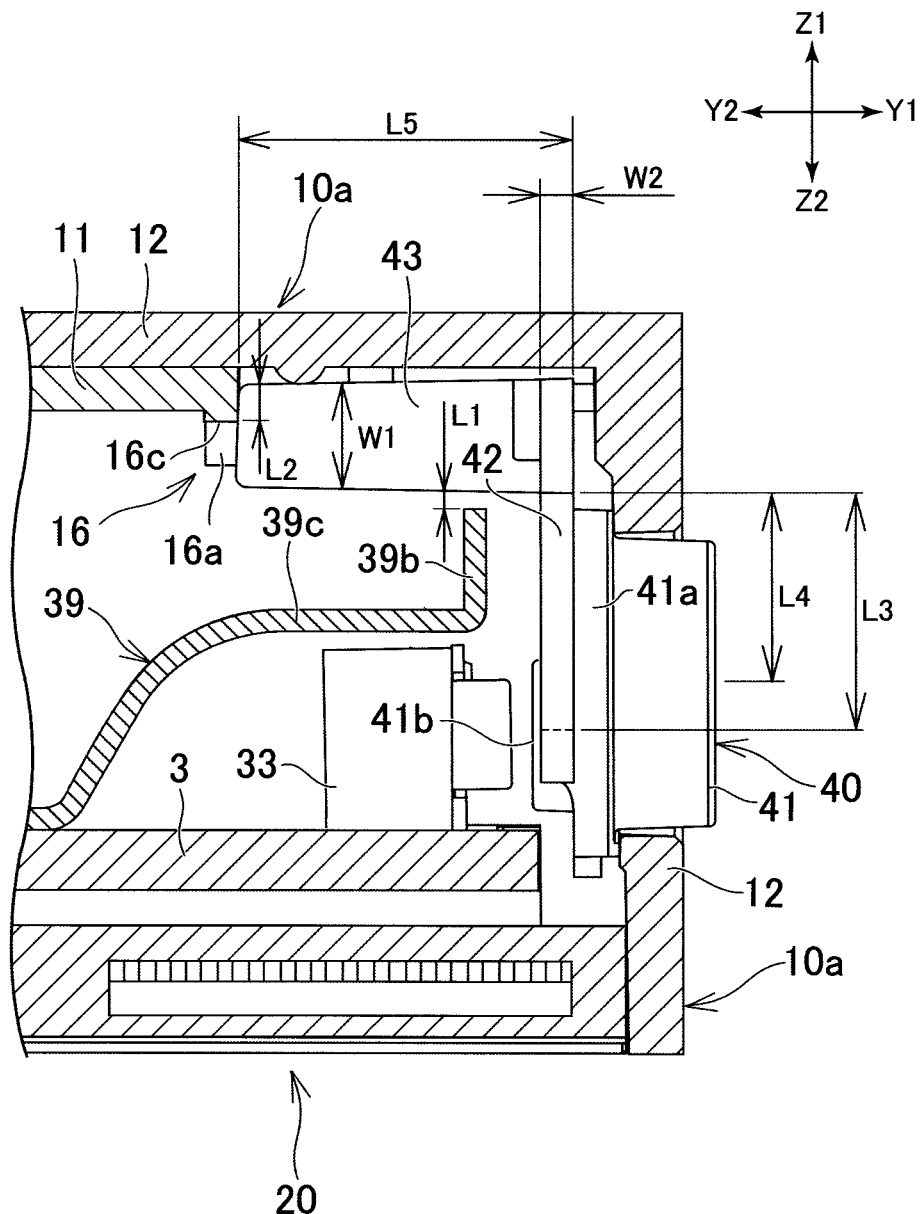
FIG. 15 is a sectional view of the electronic apparatus along line XV-XV shown in FIG. 14.

FIG. 13 is a perspective view of the button member 40. FIG. 14 is an enlarged view of a region shown by XIV in FIG. 4. FIG. 15 is a sectional view of the electronic apparatus 1 along line XV-XV shown in FIG. 14. In FIG. 15, a side face of the button member 40 is shown.

As shown in FIG. 13, the button member 40 has a pressed part 41 for being pressed by a user, elastic arm parts 42, and a base part 43. They are monolithically formed by resin.

In the example described here, an opening is formed in the front surface of the housing 2 (front wall part 10*b* of the first exterior member 10). The button member 40 is housed in the housing 2 and the front surface of the pressed part 41 is exposed through the opening of the housing 2 as shown in FIG. 1. As shown in FIG. 15, a switch 33 mounted on the circuit board 3 is disposed on the rear side of the pressed part 41. Through rearward pressing of the pressed part 41 by a user, the switch 33 enters the on-state or off-state. The opening for exposing the button member 40 may be formed in the second exterior member 20.

As shown in FIG. 13, the button member 40 of the example described here has the two elastic arm parts 42. The pressed part 41 is disposed between the two elastic arm parts 42. One end part of each of the elastic arm parts 42 is connected to the pressed part 41. The elastic arm parts 42 extend in a direction intersecting the direction in which a user presses the pressed part 41 (hereinafter, the direction in which the pressed part 41 is pressed will be referred to as the "button pressing direction"). In the example described here, the button pressing direction is the rearward direction and the elastic arm part 42 extend upward from the pressed part 41. When the pressed part 41 is pressed by a user, the elastic arm parts 42 generate a reaction force against the pressing. When the pressing by the user is released, the pressed part 41 reverts to the initial position. Specifically, the pressed part 41 returns to a position at which, as shown in FIG. 15, a flange part 41*a* formed at the periphery of the pressed part 41 abuts against an edge formed at the front wall part 10*b* of the housing 2.

As shown in FIG. 13, the base part 43 is formed at the other end parts (in the example described here, upper ends) of the elastic arm parts 42. The base part 43 extends from the elastic arm parts 42 in the button pressing direction. That is, the base part 43 extends rearward. As shown in FIGS. 14 and 15, a support part 16 is provided inside the housing 2. The support part 16 is located on the rear side (in the button pressing direction) relative to the base part 43. When the pressed part 41 is pressed, the support part 16 supports the base part 43 in the opposite direction to the pressing direction. Such button member 40 and attachment structure can reduce the number of components and can also simplify attachment work of the button member 40.

In the example described here, the opening for exposing the pressed part 41 is formed in the front wall part 10b of the housing 2. The housing 2 has another wall part intersecting the front wall part 10b. The support part 16 is formed on this another wall part. Specifically, as shown in FIG. 15, the support part 16 is formed on the inner surface of the upper wall part 10a. In this manner, the opening for exposing the pressed part 41 is formed in one of two wall parts intersecting each other and the support part 16 is formed on the other wall part. According to this structure, there is no need to provide a dedicated component as the support part 16. Thus, the number of components can be reduced and attachment work of the button member 40 can also be simplified.

A recess is formed in the upper wall part 10a and the base part 43 is disposed in this recess. This facilitates ensuring of the length of the elastic arm parts 42. As a result, adjustment of the force necessary for the user to press the pressed part 41 is made easy and the elastic deformation of the elastic arm parts 42 is facilitated. The first exterior member 10 of the example described here has the inner layer portion 11 and the outer layer portion 12 as described above. As shown in FIG. 15, the inner layer portion 11 is not formed in the region in which the base part 43 is disposed similarly to the above-described regions A1 and A2. That is, the recess is formed in the inner surface of the upper wall part 10a by utilizing that the inner layer portion 11 is not formed. The first exterior member 10 does not necessarily need to have the double-layer structure in the region in which the base part 43 is disposed. In this case, the recess may be formed in the upper wall part 10a formed of one layer and the base part 43 may be disposed in this recess.

As shown in FIG. 14, the support part 16 protrudes from the upper wall part 10a and surrounds the rear part of the base part 43. Specifically, the support part 16 has a left part 16a and a right part 16b between which the base part 43 is disposed. Furthermore, the support part 16 has a rear part 16c located on the rear side of the base part 43. When the pressed part 41 is pressed in the button pressing direction, the rear part 16c supports the base part 43 in the opposite direction to the button pressing direction. This structure can stabilize the position of the base part 43 of the button member 40. As shown in FIG. 15, the support part 16 is molded monolithically with the inner layer portion 11. This can suppress generation of sink marks of resin in the outer surface of the housing 2 (outer surface of the first exterior member 10) attributed to the support part 16.

In the housing 2, a component opposed to the upper wall part 10a with the intermediary of the base part 43 is disposed. In the example shown in FIG. 15, the chassis 39 covering the circuit board 3 is opposed to the upper wall part 10a in the vertical direction with the intermediary of the base part 43. This can suppress separation of the base part 43 from the upper wall part 10a more surely. In the example shown in FIG. 15, the chassis 39 has a switch cover part 39c that covers the switch 33. A protrusion 39b extending toward the base part 43 is formed at the edge of the switch cover part 39c. By this protrusion 39b, separation of the base part 43 from the upper wall part 10a can be suppressed more surely. Distance L1 between the protrusion 39b and the base part 43 is smaller than width L2 of the part overlapping with the rear part 16c of the support part 16 in the base part 43.

The elastic arm parts 42 bias the pressed part 41 forward also in the initial state (state in which the pressed part 41 is not pressed by a user). Furthermore, the size of the opening formed in the front wall part 10b of the housing 2 corresponds to the size of the pressed part 41. Therefore, the positional deviation of the button member 40 is restricted also by the biasing force (elastic force) of the elastic arm parts 42. Specifically, by the elastic force of the elastic arm parts 42, the pressed part 41 is pressed against the edge of the opening in the front wall part 10b and the base part 43 is pressed against the rear part 16c of the support part 16. Therefore, the positional deviation of the button member 40 is restricted.

As shown in FIG. 13, the connection parts between the elastic arm parts 42 and the pressed part 41 (end parts of the elastic arm parts 42) are located on the lower side relative to the center of the pressed part 41. Specifically, as shown in FIG. 15, distance L3 from the base part 43 to the connection part between the elastic arm part 42 and the pressed part 41 is longer than distance L4 from the base part 43 to the center of the pressed part 41. This allows ensuring of the length of the elastic arm parts 42 and facilitates the elastic deformation of the elastic arm parts 42. The position of the switch 33 is offset from the center of the pressed part 41 in such a direction as to get away from the base part 43, specifically in the downward direction. A protrusion 41b for pressing the switch 33 is formed on the rear surface of the pressed part 41 (surface on the side of the switch 33).

The button member 40 has the two elastic arm parts 42. The pressed part 41 is disposed between the two elastic arm parts 42. The elastic arm parts 42 are connected to the outer circumferential part of the pressed part 41. The two elastic arm parts 42 extend upward and get close to each other with bending to be connected to the tip of the common base part 43. The base part 43 extends rearward from the connection part of the two elastic arm parts 42. By connecting the two elastic arm parts 42 to the one base part 43 in this manner, the placement region of the base part 43 in the upper wall part 10a can be reduced. In the example described here, the base part 43 is disposed in the recess in the upper wall part 10a. Thus, the region of the recess (region in which the inner layer portion 11 is not formed) can be narrowed by connecting the two elastic arm parts 42 to the one base part 43 in this manner.

As shown in FIG. 15, thickness W1 of the base part 43 is larger than thickness W2 of the elastic arm part 42. This can increase the stability of the support by the left part 16a and the right part 16b of the support part 16. That is, suppression of the positional deviation of the support part 16 in the right direction and the left direction is facilitated. The rear part 16c of the support part 16 is lower than the left part 16a and the right part 16b in height.

Figure 16A:
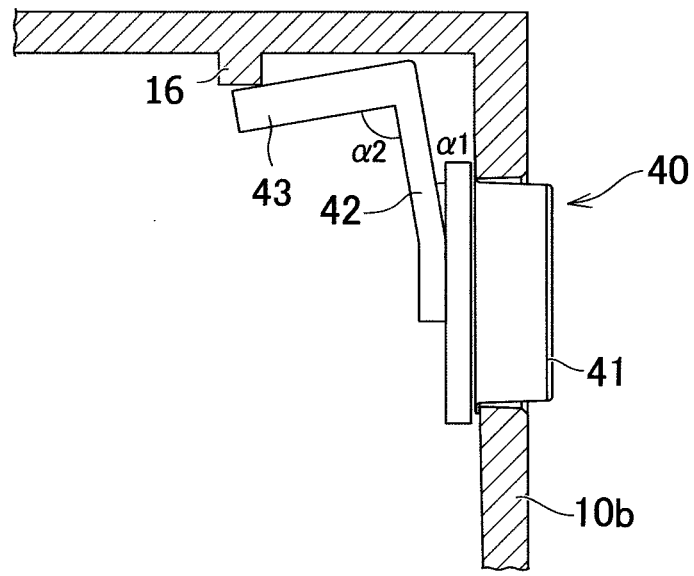
FIGS. 16A and 16B are diagrams showing an attachment step of the button member.
Figure 16B:
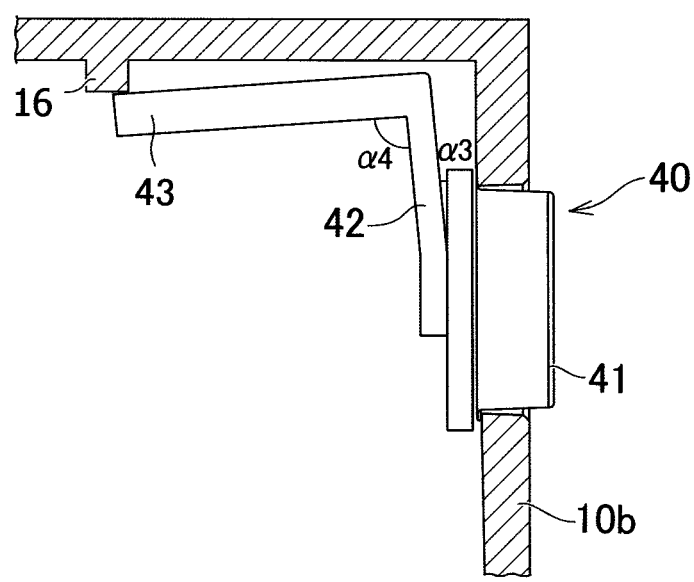

The base part 43 of the example described here is formed comparatively long. Specifically, length L5 of the base part 43 in the button pressing direction is larger than the width (thickness) W1 of the base part 43 in the extension direction of the elastic arm parts 42. Due to this, work of attaching the button member 40 to the housing 2 can be smoothly performed. In the example described here, the length L5 is longer than the distance L3 from the base part 43 to the connection part between the elastic arm part 42 and the pressed part 41. FIGS. 16A and 16B are diagrams showing the attachment step of the button member 40. FIG. 16A shows an attachment process when the base part 43 is set short. FIG. 16B shows an attachment process when the base part 43 is set long.

In attaching the button member 40 to the housing 2, first the pressed part 41 is fitted into the opening formed in the housing 2 as shown in these diagrams. At this time, the pressed part 41 is disposed right with respect to the opening because the size of the opening substantially corresponds with the size of the pressed part 41. That is, the pressed part 41 is disposed in substantially parallel to the wall part in which the opening is formed (in the above description, front wall part 10b). On the other hand, the rear end of the base part 43 is not fitted to the inside of the support part 16 but located on the support part 16. Therefore, the base part 43 and the elastic arm parts 42 are inclined. As shown in FIG. 16A, when the base part 43 is set short, an angle α1 of the elastic arm part 42 from the pressed part 41 is large and an angle α2 of the base part 43 from the elastic arm part 42 is small. That is, a large burden acts on the button member 40. In contrast, as shown in FIG. 16B, when the base part 43 is set long, an angle α3 of the elastic arm part 42 from the pressed part 41 is smaller than the angle α1 and an angle α4 of the base part 43 from the elastic arm part 42 is larger than the angle α2. That is, the burden acting on the button member 40 is smaller. Thus, work of attaching the button member 40 to the housing 2 can be smoothly performed.

[Light Leakage Prevention Structure]

Figure 17:
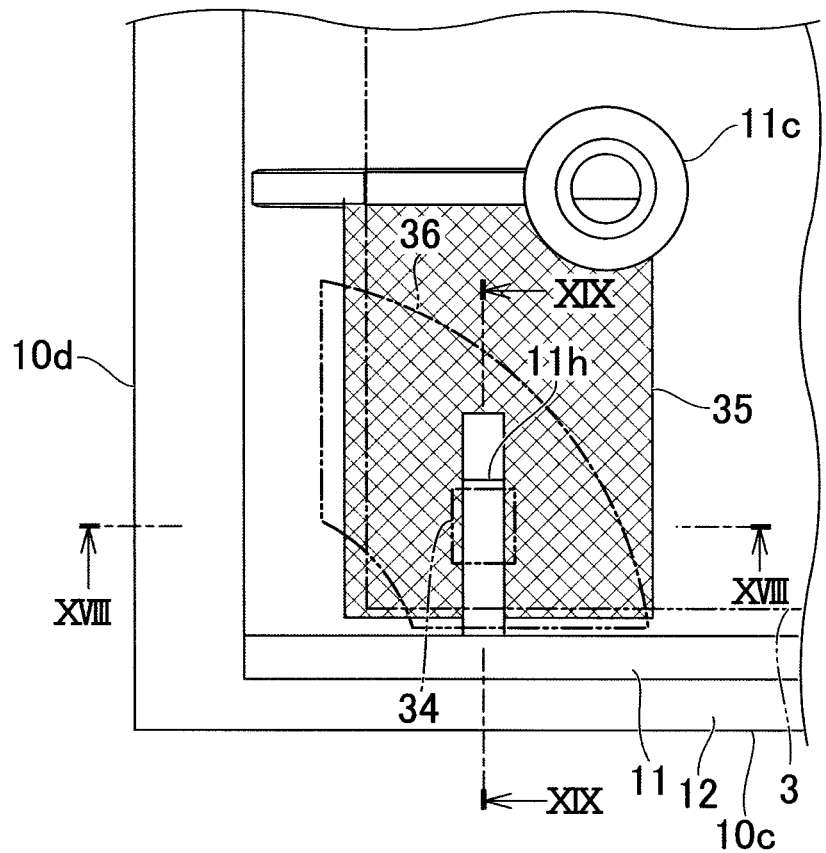
FIG. 17 is an enlarged view of a region shown by XVII in FIG. 4.
Figure 18:
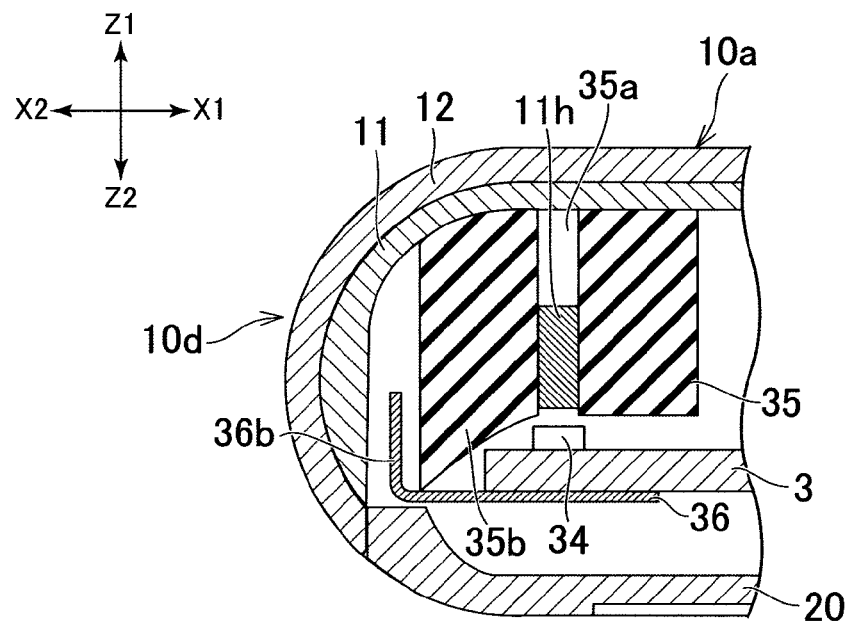
FIG. 18 is a sectional view of the electronic apparatus along line XVIII-XVIII shown in FIG. 17.
Figure 19:
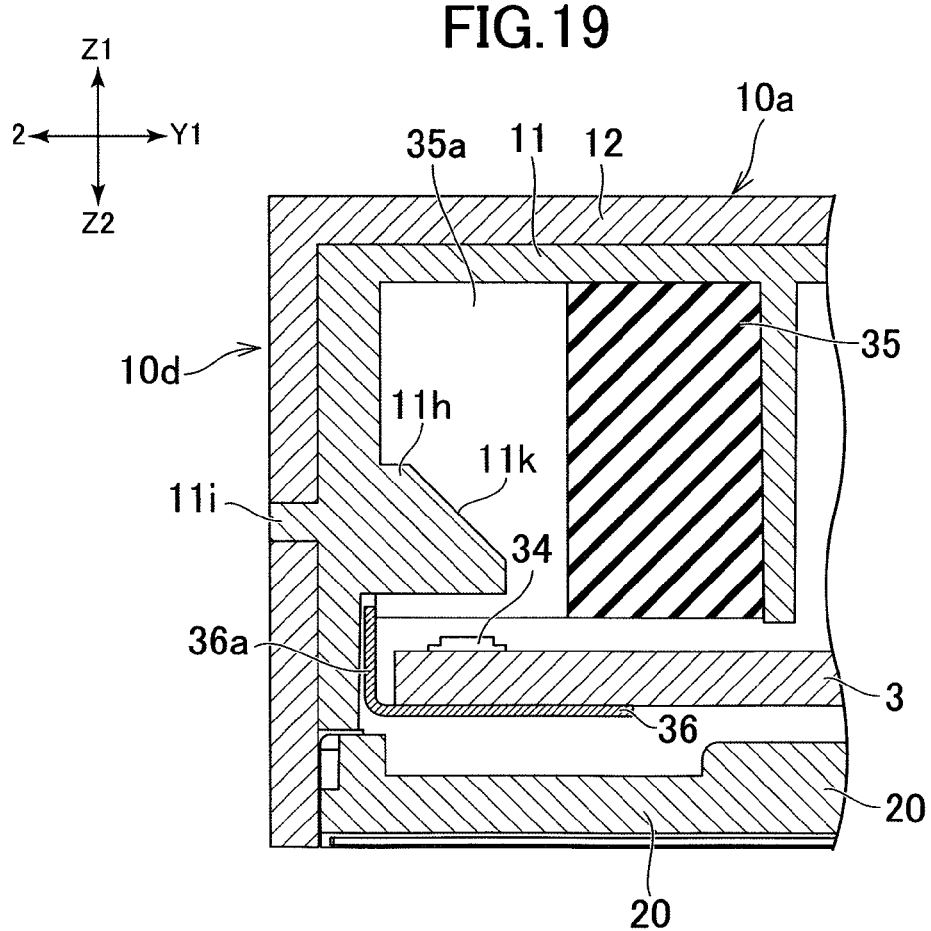
FIG. 19 is a sectional view of the electronic apparatus along line XIX-XIX shown in FIG. 17.

FIG. 17 is an enlarged view of a region shown by XVII in FIG. 4. FIG. 18 is a sectional view of the electronic apparatus 1 along line XVIII-XVIII shown in FIG. 17. FIG. 19 is a sectional view of the electronic apparatus 1 along line XIX-XIX shown in FIG. 17. In FIG. 17, a light blocking member 35 to be described later is hatched.

As shown in FIG. 19, an LED 34 is mounted on the circuit board 3. The LED 34 is lit according to the operating state of the electronic apparatus 1 for example. As described above, the first exterior member 10 has the double-layer structure. The inner layer portion 11 is formed of an optically transparent material. For example, the material of the inner layer portion 11 is polycarbonate as described above. The inner layer portion 11 of the rear wall part 10c has a light receiving part 11h that protrudes toward the inside of the first exterior member 10 and is opposed to the LED 34 in the vertical direction. Light of the LED 34 is incident on the light receiving part 11h. A hole is formed in the outer layer portion 12 of the rear wall part 10c and a light emitting part 11i of the inner layer portion 11 is formed inside this hole. The light emitting part 11i extends rearward from the position at which the light receiving part 11h is formed. In the light receiving part 11h, a slope 11k to reflect light incident from the LED 34 toward the light emitting part 11i is formed. Due to this, when the LED 34 is lit, light thereof goes out to the outside from the light emitting part 11i.

As shown in FIGS. 17 and 18, the light receiving part 11h is disposed inside the light blocking member 35 formed of an elastic material such as rubber. Specifically, a slit 35a is formed in the light blocking member 35 and the light receiving part 11h is disposed in this slit 35a. The slit 35a is opened toward the LED 34 and toward the rear wall part 10c. By this light blocking member 35, the incidence of light of the LED 34 on the part other than the light receiving part 11h in the inner layer portion 11 can be suppressed. As a result, for example even when the outer layer portion 12 is formed with a material or color that allows transmission of light comparatively easily, the leakage of light from the part other than the light emitting part 11i can be suppressed.

As shown in FIG. 18, the light blocking member 35 has a part 35b that blocks light traveling from the LED 34 toward the left wall part 10d. The light blocking member 35 of the example described here is formed of an elastic material. Furthermore, the left wall part 10d is curved. Therefore, the light blocking member 35 also bends in conformity with this curve. This forms the part 35b between the LED 34 and the left wall part 10d.

As shown in FIG. 19, a sheet 36 is attached to the circuit board 3. A rear part 36a of the sheet 36 is bent to be disposed along the rear wall part 10c. The rear part 36a closes the gap between the rear edge of the circuit board 3 and the light blocking member 35. This rear part 36a blocks light emitted rearward from the LED 34 toward the rear wall part 10c. As shown in FIG. 18, a left part 36b of the sheet 36 is also bent to be disposed along the left wall part 10d. Even when a gap is formed between the part 35b of the light blocking member 35 and the circuit board 3 due to e.g. the positional deviation of the light blocking member 35, light that goes out from this gap toward the left wall part 10d can be blocked by the left part 36b.

According to the electronic apparatus 1 described above, the following advantages are obtained.

The first exterior member 10 of the electronic apparatus 1 has the inner layer portion 11 forming the inner surface thereof and the outer layer portion 12 forming the outer surface, and the inner layer portion 11 and the outer layer portion 12 are formed by two-color molding. Furthermore, in the inner surface of the first exterior member 10, the regions A1 and A2, in which the inner layer portion 11 is not formed or the inner layer portion 11 is thin, are set and components (specifically, connectors 31A and 31C) are disposed in these regions. This can reduce the width of the electronic apparatus 1 in the vertical direction. Furthermore, the thickness of the outer layer portion 12 can be made even, which can suppress generation of concavities and convexities in the outer surface attributed to sink marks of resin in the molding. Moreover, because the thickness of the first exterior member 10 is not wholly reduced, the rigidity of the first exterior member 10 can be ensured.

The attachment protrusions 11c to which the screws 19 that fix the circuit board 3 to the first exterior member 10 are attached are molded monolithically with the inner layer portion 11. This can suppress generation of sink marks of resin in the outer surface of the first exterior member 10 attributed to the attachment protrusions 11c.

The first exterior member 10 has the upper wall part 10a, and the rear wall part 10c, the left wall part 10d and the right wall part 10e, which are connected to edges of the upper wall part 10a. These wall parts have the inner layer portion 11 and the outer layer portion 12. This can further increase the strength of the first exterior member 10.

The first exterior member 10 has the front wall part 10b in which the openings 13a to 13d for insertion of cables connected to the connectors 31A to 31D are formed. The front wall part 10b has the outer layer portion 12 and the inner surface of the front wall part 10b does not have the inner layer portion 11 at the parts opposed to the connectors 31A to 31D. This reduces the distances between the connectors 31A to 31D and the openings 13a to 13d and thus makes it easy for a user to connect cables. Furthermore, the space occupied by the connectors 31A to 31D in the space inside the housing 2 can be decreased and thus the layout of components in the housing 2 can be made easy.

The inner layer portion 11 is formed of a material having lower hardness than the outer layer portion 12. This can realize the first exterior member 10 having high strength against the external force.

In the field of electronic apparatus disclosed in US Patent Application Publication No. 2012/188694, a housing has two exterior members opposed to each other and is formed by combining them in some cases. In one example, an upper exterior member has a box shape whose lower surface is opened and a lower exterior member has a box shape whose upper surface is opened. The upper exterior member and the lower exterior member are combined with each other in the vertical direction to form a box-shaped housing. However, in terms of favorable appearance of electronic apparatus, it is not preferable to fix the two exterior members to each other by a component such as a screw exposed at the outer surface of the electronic apparatus. Reducing the thickness of the exterior member is effective for size reduction of electronic apparatus. However, reducing the thickness of the exterior member lowers the rigidity of the exterior member.

The electronic apparatus 1 has the first exterior member 10 and the second exterior member 20. The electronic apparatus 1 has the housing 2 formed by combining them, the engaged parts 15 formed in the first exterior member 10, and the engagement parts 22a, which are formed in the second exterior member 20 and get caught on the engaged parts 15 of the first exterior member 10 to combine the second exterior member 20 with the first exterior member 10. The second exterior member 20 has the metal plate 21 and the resin portion 22 provided at at least part of the periphery of the metal plate 21. The engagement parts 22a of the second exterior member 20 are molded monolithically with the resin portion 22 and are elastically deformable. According to this, the rigidity of the second exterior member 20 can be ensured because the metal plate 21 is used. Furthermore, because the elastically deformable engagement parts 22a are formed on the resin portion 22, the first exterior member 10 and the second exterior member 20 can be easily assembled with suppression of the exposure of the attachment structure at the outer surface of the electronic apparatus 1.

The manufacturing method of the electronic apparatus 1 includes: preparing the metal plate 21; forming, by insert molding, the resin portion 22 having the engagement parts 22a for being engaged with the engaged parts 15 of the first exterior member 10 at at least part of the peripheral part of the metal plate 21 and employing the resulting object as the second exterior member 20; and elastically deforming the engagement parts 22a of the second exterior member 20 and engaging the engagement parts 22a with the engaged parts 15 of the first exterior member 10 to combine the first exterior member 10 with the second exterior member 20. According to this, the rigidity of the second exterior member 20 can be ensured because the metal plate 21 is used. Furthermore, because the engagement parts 22a are formed on the resin portion 22, the elastic deformation of the engagement parts 22a is facilitated. Because the engagement parts 22a of the second exterior member 20 are engaged with the engaged parts 15 of the first exterior member 10 to combine the first exterior member 10 with the second exterior member 20, the exposure of the attachment structure at the outer surface of the electronic apparatus 1 can be suppressed. Furthermore, because the engagement parts 22a are formed on the resin portion 22 and thus the elastic deformation of the engagement parts 22a is facilitated, the first exterior member 10 and the second exterior member 20 can be easily assembled.

The engagement parts 21a of the second exterior member 20 are formed on the metal plate 21. The resin portion 22 has the engagement parts 22a. If the assembling direction of the first exterior member 10 and the second exterior member 20 is defined as a first direction, the engagement parts 22a are located on the opposite side to the engagement parts 21a in a second direction perpendicular to the first direction. According to this, the engagement parts 21a can be engaged with the engaged parts 14 of the first exterior member 10 in a state in which the second exterior member 20 is inclined relative to the first exterior member 10 and then the engagement parts 22a can be engaged with the engaged parts 15. Thus, work of assembling the two exterior members 10 and 20 can be made easy.

The second exterior member 20 is fitted to the inside of the first exterior member 10. The metal plate 21 has the front edge 21b abutting against the inside of the first exterior member 10. According to this, the strength of the first exterior member 10 can be increased by the metal plate 21.

The metal plate 21 and the resin portion 22 of the second exterior member 20 are formed by insert molding. This can strongly fix the metal plate 21 and the resin portion 22 without increasing the thickness of the whole of the second exterior member 20.

In small-size electronic apparatus like one disclosed in US Patent Application Publication No. 2012/188694, buttons having comparatively small sizes are used as various buttons such as a power button. The button should generate a reaction force when being pressed by a user. As a structure to generate the reaction force, there is e.g. a structure in which an elastically deformable arm is formed for the button and an end part of the arm is fixed to the inner surface of the housing by heat welding. When the heat welding is used to fix the arm of the button, the manufacturing step of the electronic apparatus becomes complicated. When the size of the button becomes smaller, work of the heat welding becomes further complicated.

In the electronic apparatus 1, the button member 40 has the pressed part 41 for being pressed by a user, the elastic arm parts 42 extending from the pressed part 41 in a direction intersecting the button pressing direction, and the base part 43, which is formed at end parts of the elastic arm parts 42 and extends along the button pressing direction. Inside the housing 2, the support part 16 is provided, which is located in the button pressing direction relative to the base part 43 and supports the base part 43 in the opposite direction to the button pressing direction when the pressed part 41 is pressed. This can simplify work of attaching the button member compared with the related-art structure in which the button member is attached by heat welding.

The opening for exposing the pressed part 41 is formed in the front wall part 10b and the support part 16 is formed on the inner surface of the upper wall part 10a. This eliminates the need for a dedicated member functioning as the support part 16. Thus, reduction in the number of components can be achieved and the structure can be simplified.

A recess is formed in the inner surface of the upper wall part 10a and the base part 43 is disposed in this recess. According to this, ensuring of the length of the elastic arm parts 42 is facilitated and adjustment of the force necessary for the user to press the pressed part 41 is made easy.

Inside the housing 2, the chassis 39 opposed to the upper wall part 10a with the intermediary of the base part 43 is disposed, and separation of the base part 43 from the inner surface of the upper wall part 10a is suppressed by this chassis 39. This can suppress separation of the button member 40 from the upper wall part 10a more surely.

The button member 40 has the two elastic arm parts 42 and end parts of the two elastic arm parts 42 are connected to the common base part 43. This can reduce the region for disposing the base part 43.

Embodiments of the present disclosure are not limited to the electronic apparatus described above and various changes may be made. For example, an embodiment of the present disclosure may be applied to electrode apparatus having a display and an operation member.

The present technology contains subject matter related to those disclosed in Japanese Priority Patent Applications JP 2013-192810, JP 2013-192811, and JP 2013-192812 each filed in the Japan Patent Office on Sep. 18, 2013, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic apparatus comprising:
   a housing configured to have: (i) an inner layer portion having first and second spaced apart surfaces, the second surface of the inner layer portion forming an inner surface of the housing, and (ii) an outer layer portion having first and second spaced apart surfaces, the first surface of the outer layer portion forming an outer surface of the housing, wherein the inner layer portion and the outer layer portion are formed by primary and secondary molding steps such that the inner layer portion and the outer layer portion are in a multi-layer, configuration in which a substantial portion of the first surface of the inner layer portion is in contact with, and is adhered to, the second surface of the outer layer portion;
   at least one recess disposed within the inner surface of the housing, the at least one recess characterized by a region in which the inner layer portion is one of not formed and thinner than other regions of the inner layer portion; and
   a component disposed in the housing and located such that at least a portion thereof is located within the recess.

2. The electronic apparatus according to claim 1, wherein a circuit board is housed in the housing and the housing has an attachment protrusion to which a screw that fixes the circuit board to the housing is attached on the inner surface of the housing, and
   the attachment protrusion is molded monolithically with the inner layer portion.

3. The electronic apparatus according to claim 1, wherein the housing has a first wall part and a second wall part connected to an edge of the first wall part,
   each of the first wall part and the second wall part has the inner layer portion and the outer layer portion, and
   the one region in which the component is disposed is set in the inner surface of one wall part of the first wall part and the second wall part.

4. The electronic apparatus according to claim 1, wherein the component is a connector to which a cable is connected,
   the housing has a first wall part having the inner layer portion and the outer layer portion and a third wall part that is connected to an edge of the first wall part and has an opening for insertion of the cable connected to the connector, and the one region in which the connector is disposed is set in the inner surface of the first wall part,
   the third wall part has the outer layer portion, and
   the inner surface of the third wall part does not have the inner layer portion at a part opposed to the connector.

5. The electronic apparatus according to claim 1, wherein the inner layer portion is formed of a material having lower hardness than the outer layer portion.

6. The electronic apparatus according to claim 3, wherein the inner layer portion of the second wall part has a curved outer surface, and
   the outer layer portion of the second wall part is curved along the outer surface of the inner layer portion of the second wall part.

7. The electronic apparatus according to claim 1, further comprising:
   a button member configured to have a pressed part that is exposed from an opening formed in the housing and is for being pressed in a first direction by a user, an elastic arm part that extends from the pressed part in a second direction intersecting the first direction and generates a reaction force when the pressed part is pressed in the first direction, and a base part that is formed at an end part of the elastic arm part and extends in the first direction, the pressed part, the elastic arm part, and the base part being monolithically molded; and
   a support part configured to be provided inside the housing and be located in the first direction relative to the base part, the support part supporting the base part in an opposite direction to the first direction when the pressed part is pressed in the first direction.

8. The electronic apparatus according to claim 7, wherein the housing has a first wall part in which the opening is formed and a second wall part intersecting the first wall part, and
   the support part is formed monolithically with the inner surface of the second wall part.

9. The electronic apparatus according to claim 8, wherein a recess is formed in the inner surface of the second wall part, and
   the base part is disposed in the recess.

10. The electronic apparatus according to claim 8, wherein a member that is opposed to the second wall part with intermediary of the base part and restricts separation of the base part from the inner surface of the second wall part is disposed inside the housing.

11. The electronic apparatus of claim 1, wherein the inner layer portion and the outer layer portion are formed by a two color molding technique having the primary and secondary molding steps.

* * * * *